(12) United States Patent
Bae et al.

(10) Patent No.: US 11,817,432 B2
(45) Date of Patent: Nov. 14, 2023

(54) DISPLAY DEVICE

(71) Applicant: Samsung Display Co., LTD., Yongin-si (KR)

(72) Inventors: Sung Geun Bae, Yongin-si (KR); Jeong Nyun Kim, Yongin-si (KR); Zu Seok Oh, Yongin-si (KR); Jeong Hyun Lee, Yongin-si (KR); Jong Chan Lee, Yongin-si (KR); Da Sol Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 264 days.

(21) Appl. No.: 17/313,490

(22) Filed: May 6, 2021

(65) Prior Publication Data

US 2022/0077121 A1 Mar. 10, 2022

(30) Foreign Application Priority Data

Sep. 7, 2020 (KR) .................. 10-2020-0114160

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/507* (2013.01);
(Continued)

(58) Field of Classification Search
CPC ............. H01L 25/0753; H01L 27/1214; H01L 33/507; H01L 33/58; H01L 33/60; H01L 2933/0091
See application file for complete search history.

(56) References Cited

U.S. PATENT DOCUMENTS 10,371,984 B2 * 8/2019 Song .................. G02B 5/201
11,037,914 B2 * 6/2021 Kim .................. H01L 25/167
(Continued)

FOREIGN PATENT DOCUMENTS

KR 10-2018-0035287 4/2018
KR 10-2018-0087502 8/2018
(Continued)

OTHER PUBLICATIONS

International Search Report corresponding to International Application No. PCT/KR2021/011961 dated Dec. 21, 2021.

*Primary Examiner* — Mary Ellen Bowman
(74) *Attorney, Agent, or Firm* — KILE PARK REED & HOUTTEMAN PLLC

(57) ABSTRACT

A display device includes a base layer including a display area, a first pixel, a second pixel, and a third pixel disposed in the display area and including light-emitting elements disposed in light-emitting areas, a first light conversion layer, a second light conversion layer, and a third light conversion layer on the light-emitting areas of the first pixel, the second pixel, and the third pixel, respectively, a light blocking layer between the first, second and third light conversion layers, and having a height lower than the first, second, and third light conversion layers, the light blocking layer surrounding a portion of side surfaces of the first, second and third light conversion layers, and a first reflective layer disposed on the light blocking layer and surrounding the first, second and third light conversion layers.

20 Claims, 25 Drawing Sheets

(51) Int. Cl.
  *H01L 33/58*   (2010.01)
  *H01L 33/60*   (2010.01)
  *H01L 33/50*   (2010.01)
(52) U.S. Cl.
  CPC .............. *H01L 33/58* (2013.01); *H01L 33/60* (2013.01); *H01L 2933/0091* (2013.01)

(56) References Cited

U.S. PATENT DOCUMENTS

2018/0210282 A1    7/2018  Song et al.
2021/0143137 A1    5/2021  Kim et al.
2021/0399181 A9*  12/2021  Kang .................... G06F 1/1652

FOREIGN PATENT DOCUMENTS

| KR | 10-2020-0001649 | 1/2020 |
| KR | 10-2020-0005692 | 1/2020 |
| KR | 10-2020-0073340 | 6/2020 |
| KR | 10-2021-0057891 | 5/2021 |

* cited by examiner

DISPLAY DEVICE

CROSS-REFERENCE TO RELATED APPLICATION(S)

This application claims priority to and benefits of Korean Patent Application No. 10-2020-0114160 under 35 U.S.C. § 119, filed in the Korean Intellectual Property Office on Sep. 7, 2020, the entire contents of which are incorporated herein by reference.

BACKGROUND

1. Technical Field

The disclosure relates to a display device.

2. Description of the Related Art

Recently, interest in information display is increasing. Accordingly, research and development for display devices is continuously being conducted.

SUMMARY

An embodiment of the disclosure may provide a display device capable of improving light efficiency.

Aspects of the disclosure are not limited to the aforesaid, but other objects not described herein will be clearly understood by those skilled in the art from descriptions below.

A display device according to an embodiment of the disclosure may include a base layer including a display area, a first pixel, a second pixel, and a third pixel that are disposed in the display area and include light-emitting elements disposed in light-emitting areas, a first light conversion layer, a second light conversion layer, and a third light conversion layer that are disposed on the light-emitting areas of the first pixel, the second pixel, and the third pixel, respectively, a light blocking layer disposed between the first light conversion layer, the second light conversion layer, and the third light conversion layer, and having a height lower than the first light conversion layer, the second light conversion layer, and the third light conversion layer, the light blocking layer surrounding a portion of side surfaces of the first light conversion layer, the second light conversion layer, and the third light conversion layer, and a first reflective layer disposed on the light blocking layer, the first reflective layer surrounding the first light conversion layer, the second light conversion layer, and the third light conversion layer.

In an embodiment, with respect to a surface of the base layer, the first reflective layer may include a height less than or equal to a height of the first light conversion layer, the second light conversion layer, and the third light conversion layer, and the first reflective layer may include openings corresponding to the first light conversion layer, the second light conversion layer, and third light conversion layer.

In an embodiment, the first pixel, the second pixel, and the third pixel may include light-emitting elements which emit light of a same color.

In an embodiment, at least one of the first light conversion layer, the second light conversion layer, and the third light conversion layer may include color conversion particles which convert light emitted from the light-emitting elements into light of a different color.

In an embodiment, at least one of the first light conversion layer, the second light conversion layer, and the third light conversion layer may include light scattering particles which scatter light emitted from the light-emitting elements.

In an embodiment, each of the first light conversion layer, the second light conversion layer, and the third light conversion layer may have a dome shape, and may protrude to a height higher than the first reflective layer with respect to a surface of the base layer.

In an embodiment, the first reflective layer may include at least one metal layer.

In an embodiment, the first reflective layer may include a first metal layer including a first metal material, and a second metal layer disposed on the first metal layer and including a second metal material.

In an embodiment, each of the first light conversion layer, the second light conversion layer, and the third light conversion layer may have a flat upper surface, and with respect to a surface of the base layer, the first reflective layer, the first light conversion layer, the second light conversion layer, and the third light conversion layer may have a same height.

In an embodiment, the light blocking layer may include a black matrix material.

In an embodiment, the display device may include at least one of a protective layer overlapping the first light conversion layer, the second light conversion layer, the third light conversion layer, and the first reflective layer, and a color filter layer disposed on the first light conversion layer, the second light conversion layer, the third light conversion layer, the first reflective layer, and the protective layer.

In an embodiment, the protective layer may include at least one organic layer, and may planarize a surface of a light control layer including the first light conversion layer, the second light conversion layer, the third light conversion layer, the light blocking layer, and the first reflective layer.

In an embodiment, the color filter layer may include a first color filter disposed on the first light conversion layer, a second color filter disposed on the second light conversion layer, a third color filter disposed on the third light conversion layer, and a second reflective layer disposed between the first color filter, the second color filter, and the third color filter and surrounding the first color filter, the second color filter, and the third color filter.

In an embodiment, the second reflective layer may include at least one metal layer.

In an embodiment, the display device may further include an encapsulation layer disposed on the color filter layer and disposed on one surface of the base layer to seal the display area.

In an embodiment, the display device may further include an upper substrate disposed on the color filter layer.

In an embodiment, the first pixel, the second pixel, the third pixel, the first light conversion layer, the second light conversion layer, the third light conversion layer, the light blocking layer, and the first reflective layer may be disposed on a surface of the base layer, and the color filter layer may be disposed on a surface of the upper substrate facing the surface of the base layer.

In an embodiment, the first pixel, the second pixel, and the third pixel may be disposed on a surface of the base layer, and the first light conversion layer, the second light conversion layer, the third light conversion layer, the first reflective layer, and the color filter layer may be disposed on a surface of the upper substrate to face the first pixel, the second pixel, and the third pixel.

In an embodiment, the light blocking layer may be disposed on the surface of the base layer to face the first reflective layer.

In an embodiment, the display device may further include a light-blocking bank disposed in non-light-emitting areas of the first pixel, the second pixel, and the third pixel to surround the light-emitting areas of each of the first pixel, the second pixel, and the third pixel.

Specific details of other embodiments are included in the specification and drawings.

According to embodiments of the disclosure, a reflective layer may be disposed around the light conversion layer disposed on the light-emitting area of each pixel. Accordingly, it may be possible to provide a mirror type of the display device to satisfy diversified consumer needs.

According to embodiments of the disclosure, it may be possible to induce recycling of light emitted from each pixel by the reflective layer. Accordingly, light efficiency of the pixels and the display device including the same can be improved.

Effects according to embodiments are not limited to the above, and additional various effects are included in the specification.

DETAILED DESCRIPTION OF THE EMBODIMENTS

Figure 1:
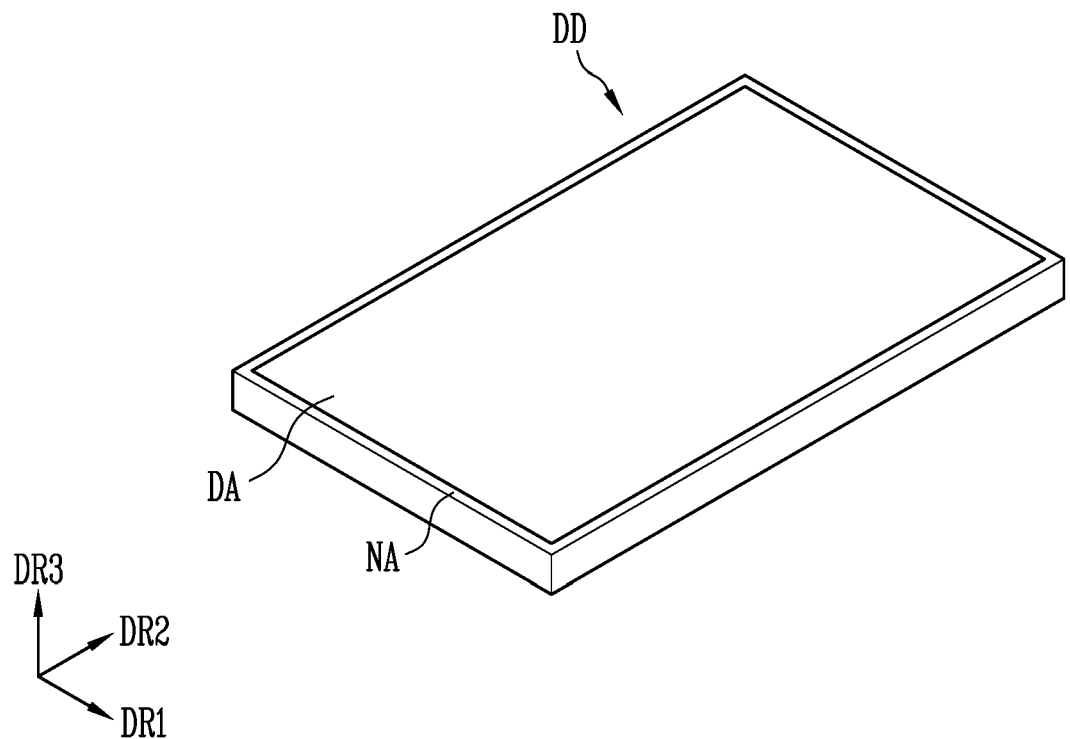
FIG. 1 is a schematic perspective view illustrating a display device according to an embodiment of the disclosure.

It will be apparent to those skilled in the art that various modifications and variations can be made in the disclosure without departing from the spirit or scope of the disclosure, and the embodiments are explained in the detailed description with reference to the drawings. The terms of a singular form may include plural forms unless the context clearly indicates otherwise.

The invention is not limited to embodiments disclosed below, and may be implemented in various forms. Each of the embodiments disclosed below may be implemented alone, or may be implemented in combination with at least one other embodiment.

In the drawings, some constituent elements which may be not directly related to features of embodiments may be omitted in order to clearly indicate aspects of the embodiments. Some of the elements in the drawing can be shown in somewhat exaggerated sizes, ratios, and the like. For the same or similar constituent elements throughout the drawings, the same reference numerals and symbols are to be given as much as possible even if they are displayed on different drawings, and duplicate descriptions will be omitted.

It will be further understood that terms such as "comprise", "include", and "have", when used in the disclosure, specify the presence of stated elements, but do not preclude the presence or addition of one or more other elements.

It will be further understood that, when an element is referred to as being "on" another element, it may be directly or indirectly on another element. For example, intervening elements may be present.

The term "overlap" may include layer, stack, face or facing, extending over, covering or partly covering or any other suitable term as would be appreciated and understood by those of ordinary skill in the art. The terms "not overlap" may include apart from or set aside from or offset from and any other suitable equivalents as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Figure 2:
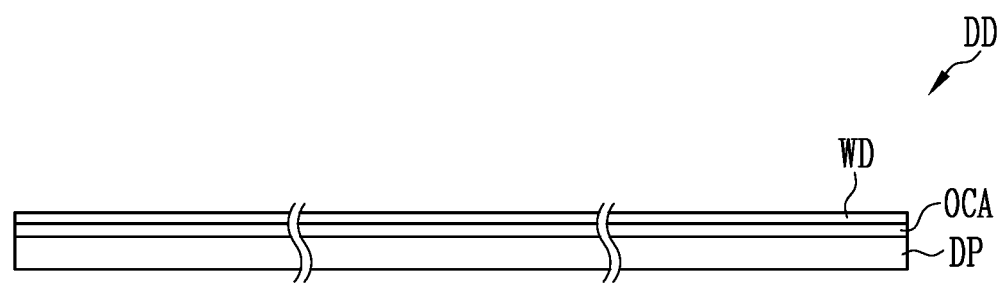
FIG. 2 is a schematic cross-sectional view illustrating a display device according to an embodiment of the disclosure.
Figure 3:
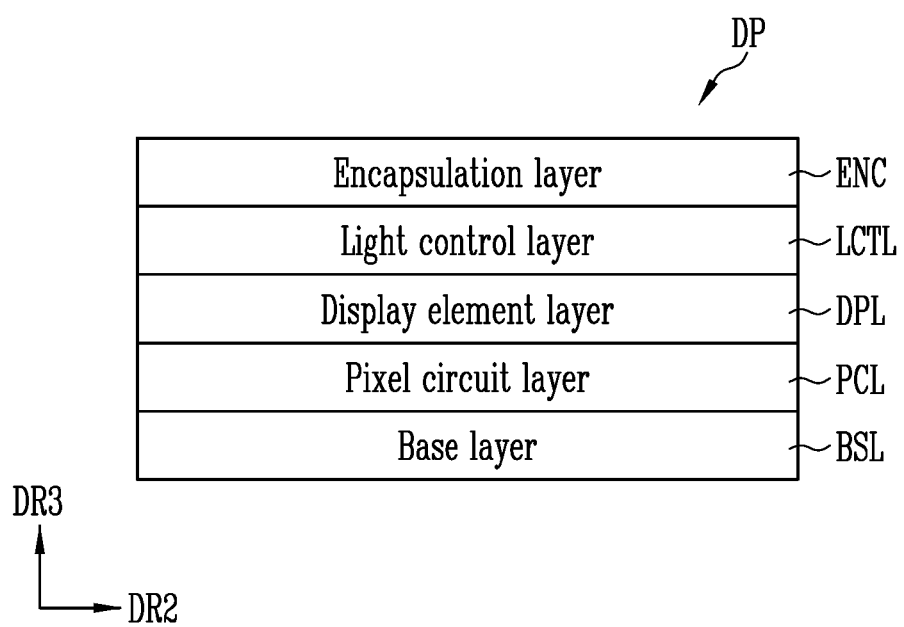
FIG. 3 is a schematic cross-sectional view illustrating a configuration of a display panel according to an embodiment of the disclosure.

FIG. 1 is a schematic perspective view illustrating a display device DD according to an embodiment. FIG. 2 is a schematic cross-sectional view illustrating a display device DD according to an embodiment. FIG. 3 is a schematic cross-sectional view illustrating a configuration of a display panel DP according to an embodiment.

Referring first to FIG. 1, the display device DD may include a display area DA and a non-display area NA (also referred to as a "bezel area"). The display area DA may be an area displaying an image via pixels. The non-display area NA may be an area other than the display area DA, and an image may not be displayed in the non-display area NA.

The display area DA may have various shapes and may include pixels. For example, the display area DA may have various shapes, including a rectangle, a circle, or an ellipse, and pixels may be arranged in the display area DA.

The display area DA may be formed on at least one surface of the display device DD. For example, the display area DA may be formed on a front surface of the display device DD and may be additionally formed on a side surface and/or a rear surface of the display device DD.

The non-display area NA may be disposed around the display area DA to surround at least one area of the display area DA. The non-display area NA may include lines, pads, and/or a driving circuit connected to the pixels of the display area DA.

The display device DD may be provided in various shapes. For example, the display device DD may be provided in a shape of a rectangular plate, but is not limited thereto. For example, the display device DD may have a shape such as a circle or ellipse. FIG. 1 illustrates the display device DD including an angled corner, but embodiments are not limited thereto. For example, the display device DD may include a curved corner.

For convenience of description, as illustrated in FIG. 1, the display device DD may have a rectangular plate shape including a pair of short sides and a pair of long sides, and an extension direction of the short side may be defined as a first direction DR1, an extension direction of the long side may be defined as a second direction DR2, and a direction perpendicular to the extension direction of the long side and the short side (e.g., a thickness or height direction of the display device DD) may be defined as a third direction DR3. However, the above directions may be changed according to the shape of the display device DD.

The display device DD may have flexibility such that at least one area thereof may be deformed, or may not have flexibility such that the entire area thereof may not be substantially deformed. For example, the display device DD may be a flexible or rigid display device. In case that at least one area of the display device DD has flexibility, the at least one area may be deformed to be folded, bent, or rolled in a flexible portion.

Referring to FIG. 2, the display device DD may include the display panel DP and a window WD disposed on the display panel DP. In an embodiment, the window WD may be integral with the display panel DP. For example, the window WD may be directly formed on a surface of the display panel DP. In another embodiment, after the window WD is manufactured separately from the display panel DP, the window WD may be coupled to the display panel DP through an optically transparent adhesive member or an optically clear adhesive (OCA).

The display panel DP may include pixels for displaying an image and may include various types and/or structures of display panels. In an embodiment, the display panel DP may be a light-emitting display panel using an ultra-small inorganic light-emitting diode having a size to a degree of a nanoscale to a microscale, but is not limited thereto.

The window WD may be disposed on the display panel DP to protect the display panel DP from external impact and may provide an input surface and/or a display surface to a user. The window WD may be formed of various materials including glass or plastic and may have flexibility in at least one area thereof or may not have flexibility in the entire area thereof.

The display device DD may further include at least one type of sensor such as a touch sensor. For example, the display device DD may include a touch sensor, a fingerprint sensor, a pressure sensor, and/or a temperature sensor.

Each sensor may be integral with the display panel DP or manufactured separately from the display panel DP and may be disposed around the display panel DP (e.g., a front surface, a rear surface, and/or a side surface). For example, the touch sensor may be provided on the front surface (an upper surface thereof on which an image may be displayed) of the display panel DP or may be integral with the display panel DP to be disposed between the display panel DP and the window WD, but the position of the touch sensor is not limited thereto.

Referring to FIG. 3, the display panel DP may include a base layer BSL, a pixel circuit layer PCL, a display element layer DPL, and an encapsulation layer ENC sequentially disposed on a surface of the base layer BSL. The display panel DP may further include a light control layer LCTL for converting and/or adjusting characteristics of light emitted from the display element layer DPL.

For example, in case that the display panel DP is a passive display panel, the pixel circuit layer PCL may be omitted. Lines for driving the pixels may be disposed under the display element layer DPL or directly connected to and/or formed on the display element layer DPL.

According to an embodiment, instead of forming the encapsulation layer ENC, an upper substrate may be disposed on a surface of the base layer BSL having the pixels. The upper substrate may be bonded to the base layer BSL by a sealing material.

The base layer BSL may be a rigid or flexible substrate (or film). In an embodiment, in case that the base layer BSL is a rigid substrate, the base layer BSL may be one or more among a glass substrate, a quartz substrate, a glass ceramic substrate, and a crystalline glass substrate. In another embodiment, in case that the base layer BSL is a flexible substrate, the base layer BSL may be one or more of a film substrate, or a plastic substrate, including a polymer organic material. The base layer BSL may include fiber glass reinforced plastic (FRP).

The pixel circuit layer PCL may be provided on a surface of the base layer BSL. The pixel circuit layer PCL may include circuit elements constituting a pixel circuit of each pixel and various lines connected to the circuit elements. For example, the pixel circuit layer PCL may include transistors and storage capacitors constituting a pixel circuit of each pixel, and gate lines, data lines, and power lines connected to each pixel circuit. According to an embodiment, the gate lines may include at least scan lines, and may further selectively include other types of control lines. The pixel circuit layer PCL may further include at least one insulating layer including a protective layer covering the circuit elements and/or lines.

The display element layer DPL may be disposed on the pixel circuit layer PCL. The display element layer DPL may include a light-emitting element constituting a light source of each pixel. In an embodiment, the light-emitting device may be an inorganic light-emitting diode (e.g., an ultra-small inorganic light-emitting diode having a nanoscale or microscale size), but is not limited thereto.

The light control layer LCTL may be provided on an image display surface side of the display panel DP. For example, in case that the display panel DP emits light in an upward direction (e.g., the third direction DR3) of the display element layer DPL to display an image on the front surface of the display panel DP, the light control layer LCTL may be disposed on the display element layer DPL. For example, the light control layer LCTL may be provided between the display element layer DPL and the encapsulation layer ENC.

The light control layer LCTL may include a color filter layer including a color filter of a color matching the color of each pixel PXL, and/or a light conversion layer including color conversion particles (e.g., quantum dots) corresponding to a color, and/or light scattering particles, thereby converting light generated in each pixel area of the display element layer DPL. For example, the light control layer LCTL may selectively transmit light of a specific wavelength band among light generated in the display element layer DPL, and/or may convert the wavelength band of light generated in the display element layer DPL.

The encapsulation layer ENC may be disposed on the display element layer DPL and/or the light control layer LCTL. The encapsulation layer ENC may be an upper substrate (also referred to as an "encapsulation substrate") or a multilayered thin film encapsulation layer. In case that the encapsulation layer ENC is a multilayered thin film encapsulation layer, the encapsulation layer ENC may include an inorganic and/or organic layer. For example, the encapsulation layer ENC may have a multilayer structure in which an inorganic layer, an organic layer, and an inorganic layer may be sequentially stacked. The encapsulation layer ENC may protect pixels by preventing external air and moisture from penetrating into the display element layer DPL and the pixel circuit layer PCL.

Figure 4:
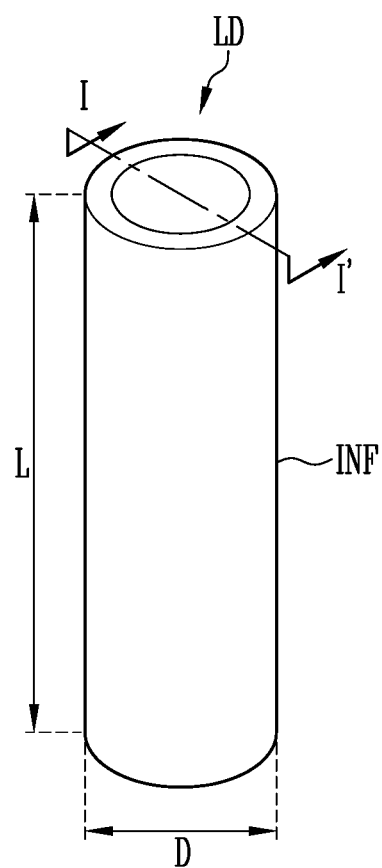
FIG. 4 is a schematic perspective view illustrating a light-emitting element according to an embodiment of the disclosure.
Figure 5:
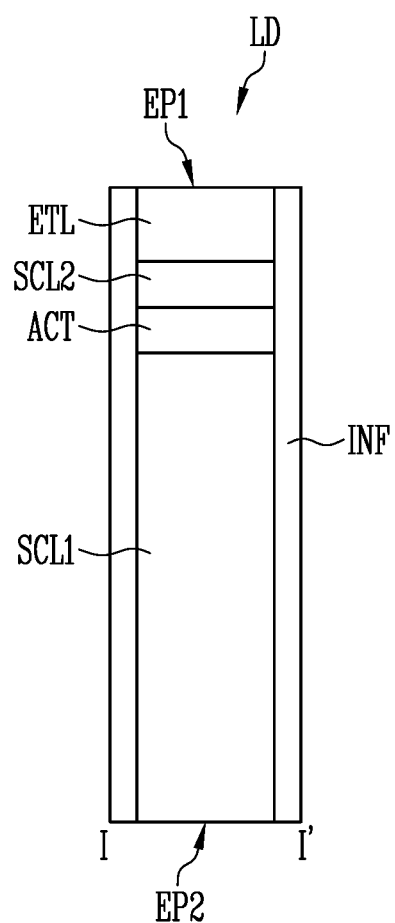
FIG. 5 is a schematic cross-sectional view illustrating a light-emitting element according to an embodiment of the disclosure.

FIG. 4 is a schematic perspective view illustrating a light-emitting element LD according to an embodiment, and FIG. 5 is a schematic cross-sectional view illustrating a light-emitting element LD according to an embodiment. For example, FIG. 4 illustrates an example of a light-emitting element LD that may be used as a light source of a pixel according to an embodiment, and FIG. 5 illustrates an example of a schematic cross sectional view of a light-emitting element LD taken along line I-I' of FIG. 4.

Referring to FIGS. 4 and 5, the light-emitting element LD may include a first semiconductor layer SCL1, an active layer ACT, and a second semiconductor layer SCL2 sequentially disposed in a direction, and an insulating film INF covering an outer circumferential surface (e.g., a side surface) of each of the first semiconductor layer SCL1, the active layer ACT, and the second semiconductor layer SCL2. The light-emitting element LD may selectively further include an electrode layer ETL disposed on the second semiconductor layer SCL2. The insulating film INF may or may not at least partially cover an outer circumferential surface of the electrode layer ETL.

In an embodiment, the light-emitting element LD may be provided in a bar or rod shape extending in a direction and may have a first end EP1 and a second end EP2 at ends in a longitudinal direction (or thickness direction). The first end EP1 may be a first bottom (or upper surface) of the light-emitting element LD, and the second end EP2 may be a second bottom (or lower surface) of the light-emitting element LD.

In the description of the embodiments, the bar shape may include a rod- or bar-like shape that may be long in the longitudinal direction (for example, having an aspect ratio greater than 1), such as a circular or polygonal column. The shape of the cross section thereof is not limited to a particular shape. For example, the length L of the light-emitting element LD may be larger than the diameter D (or the width of the cross section) thereof.

The first semiconductor layer SCL1, the active layer ACT, the second semiconductor layer SCL2, and the electrode layer ETL may be sequentially disposed in the direction from the second end EP2 to the first end EP1. For example, the first semiconductor layer SCL1 may be disposed at the second end EP2 of the light-emitting element LD, and the electrode layer ETL may be disposed at the first end EP1 of the light-emitting element LD.

The first semiconductor layer SCL1 may be a semiconductor layer of a first conductive type. For example, the first semiconductor layer SCL1 may be an N-type semiconductor layer including an N-type dopant. For example, the first semiconductor layer SCL1 may include one or more among InAlGaN, GaN, AlGaN, InGaN, AlN, and InN and may be an N-type semiconductor layer doped with a dopant such as Si, Ge, Sn, or a combination thereof. However, the material constituting the first semiconductor layer SCL1 is not limited thereto, and the first semiconductor layer SCL1 may be formed of various other materials.

The active layer ACT may be disposed on the first semiconductor layer SCL1 and may be formed in a structure of a single quantum well or a multi-quantum well. The position of the active layer ACT may be variously changed according to the type of the light-emitting element LD. The active layer ACT may emit light having a wavelength of about 400 nm to about 900 nm and may have a double hetero-structure.

A cladding layer (not illustrated) doped with a conductive dopant may be selectively formed on and/or under the active layer ACT. For example, the cladding layer may be formed of an AlGaN or InAlGaN layer. According to embodiments, materials such as AlGaN and AlInGaN may be used to form the active layer ACT, and various other materials may be used to form the active layer ACT.

In case that a voltage equal to or higher than the threshold voltage is applied to the ends of the light-emitting element LD, electron-hole pairs may be combined in the active layer ACT to cause the light-emitting element LD to emit light. The light emitting of the light-emitting element LD may be controlled using the principle, and thus the light-emitting element LD may be used as a light source for various light-emitting devices including pixels of a display device.

The second semiconductor layer SCL2 may be disposed on the active layer ACT and may be a semiconductor layer of a second conductive type different from the first conductive type of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN and may be a P-type semiconductor layer doped with a dopant such as Mg. However, the material constituting the second semiconductor layer SCL2 is not limited thereto, and various other materials may constitute the second semiconductor layer SCL2.

In an embodiment, the first semiconductor layer SCL1 and the second semiconductor layer SCL2 may have different lengths (or thicknesses) in the longitudinal direction of the light-emitting element LD. For example, the first semiconductor layer SCL1 may be longer (or thicker) than the second semiconductor layer SCL2 in the longitudinal direction of the light-emitting element LD. Therefore, the active layer ACT of the light-emitting element LD may be closer to the first end EP1 than to the second end EP2.

The electrode layer ETL may be disposed on the second semiconductor layer SCL2. The electrode layer ETL may be a contact electrode for protecting the second semiconductor layer SCL2 and smoothly connecting the second semiconductor layer SCL2 to an electrode or line. For example, the electrode layer ETL may be an ohmic contact electrode or a Schottky contact electrode.

The electrode layer ETL may be substantially transparent or translucent. Therefore, light generated by the light-emitting element LD may transmit through the electrode layer ETL and may be emitted outside the light-emitting element LD. In another embodiment, the electrode layer ETL may be opaque. Therefore, the light generated by the light-emitting element LD may not transmit through the electrode layer ETL and may be emitted outside the light-emitting element LD through a region excluding the end of the light-emitting element LD in which the electrode layer ETL may be disposed.

In an embodiment, the electrode layer ETL may include a metal or a metal oxide. For example, the electrode layer ETL may be formed of chromium (Cr), titanium (Ti), aluminum (Al), gold (Au), nickel (Ni), indium tin oxide (ITO), indium zinc oxide (IZO), indium tin zinc oxide (ITZO), zinc oxide (ZnO), oxides or alloys thereof alone or in combination.

The insulating film INF may expose the electrode layer ETL and the first semiconductor layer SCL1 at the first and second ends EP1 and EP2 of the light-emitting element LD, respectively.

In case that the insulating film INF is provided to cover the surface of the light-emitting element LD, in particular, the outer circumferential surfaces of the first semiconductor layer SCL1, the active layer ACT, the second semiconductor layer SCL2, and/or the electrode layer ETL, the insulating film INF may prevent a short defect in the light-emitting element LD. Therefore, electrical stability of the light-emitting element LD may be ensured.

In case that the insulating film INF is provided on the surface of the light-emitting element LD, surface defects in the light-emitting element LD may be minimized to increase life and efficiency thereof. When the insulating film INF is formed in each light-emitting element LD, the insulating film INF may prevent an unwanted short between the light-emitting elements LD in case that light-emitting elements LD may be adjacent to each other.

In an embodiment, the light-emitting element LD may be manufactured by a surface treatment process. For example, in case that light-emitting elements LD are mixed with a fluid solution (or solvent) and supplied to each light-emitting area (e.g., a light-emitting area of each pixel), each light-emitting element LD may be surface-treated so that the light-emitting elements LD may be uniformly dispersed in the fluid solution without non-uniformly agglomerating in the solution. According to a non-limiting embodiment, the insulating film INF itself may be formed as a hydrophobic film using a hydrophobic material, or a hydrophobic film made of a hydrophobic material may be additionally formed on the insulating film INF.

The insulating film INF may include a transparent insulating material. Therefore, light generated by the active layer ACT may transmit the insulating film INF and may be emitted outside the light-emitting element LD. For example, the insulating film INF may include at least one insulating material among silicon dioxide ($SiO_2$) or silicon oxide ($SiO_x$), silicon nitride ($Si_3N_4$) or a silicon nitride ($SiN_x$), aluminum oxide ($Al_2O_3$) or an aluminum oxide ($AlxO_y$), and titanium dioxide ($TiO_2$) or titanium oxide ($Ti_xO_y$), but is not limited thereto.

In an embodiment, the light-emitting element LD may have a size to a degree of the nanoscale to the microscale. For example, the light-emitting element LD may have the diameter D (or width) and/or the length L in the nanoscale to microscale range. However, the size of the light-emitting element LD is not limited thereto. For example, the size of the light-emitting element LD may be variously changed according to design conditions of various light-emitting devices using the light-emitting element LD as a light source.

The structure, shape, and/or type of the light-emitting element LD may be changed according to embodiments. For example, the light-emitting element LD may not include the electrode layer ETL. The light-emitting element LD may further include another electrode layer disposed at an end of the first semiconductor layer SCL1. The light-emitting element LD may be formed as a core-shell structure.

The light-emitting device including the light-emitting element LD may be used in various types of devices requiring a light source, including the display device DD. For example, light-emitting elements LD may be disposed in each pixel of the display panel DP, and the light-emitting elements LD may be used as a light source of each pixel. However, the application field of the light-emitting element LD is not limited to the above-described example, and the light-emitting element LD may be used for other types of devices such as a lighting device.

Figure 6:
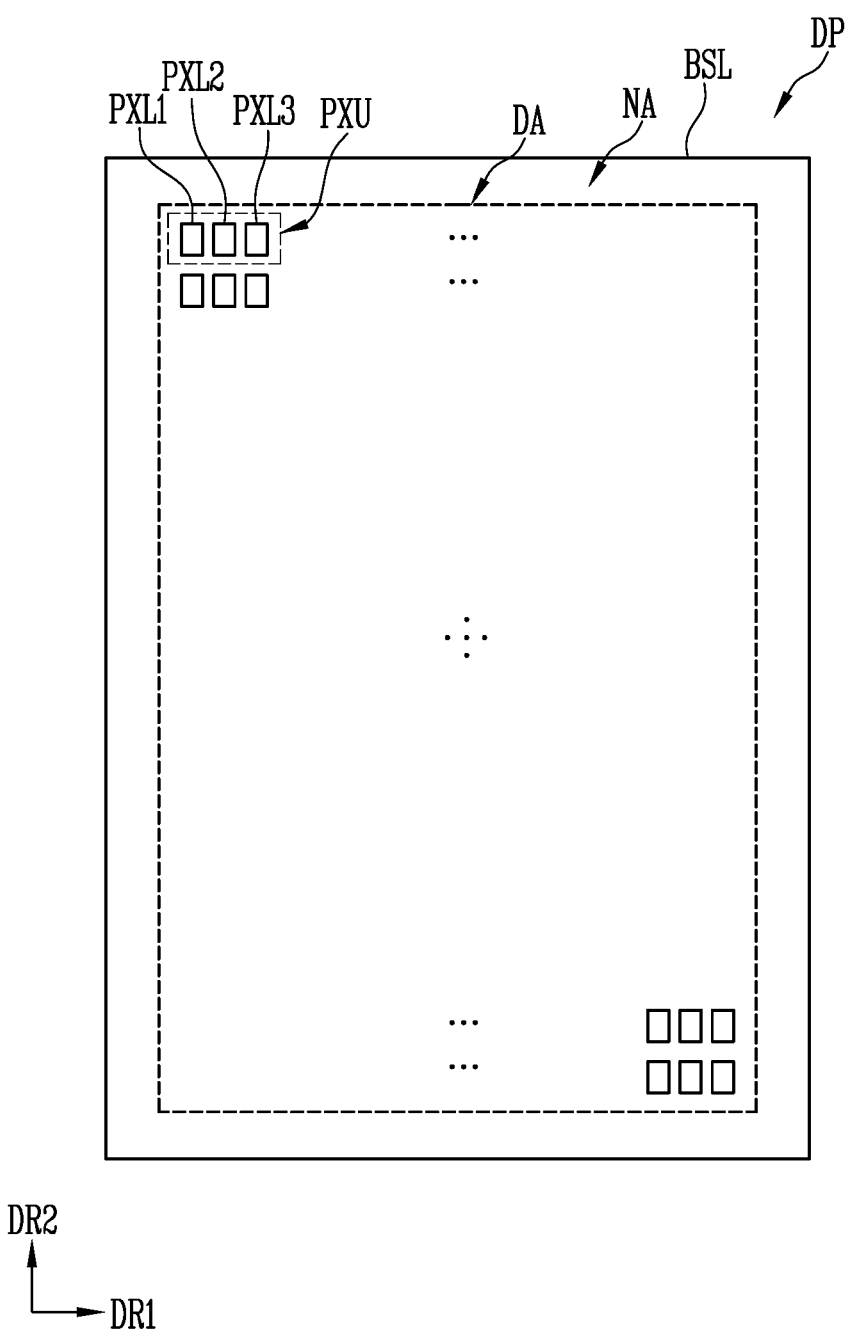
FIG. 6 is a schematic plan view illustrating a display panel according to an embodiment of the disclosure.

FIG. 6 is a schematic plan view illustrating a display panel DP according to an embodiment. According to an embodiment, the display panel DP of FIG. 6 may use the light-emitting element LD described in the embodiments of FIGS. 4 and 5 as a light source of each pixel. For example, each pixel part PXU of the display panel DP and each pixel constituting the pixel part PXU may include at least one light-emitting element LD.

For convenience of description, FIG. 6 briefly illustrates the structure of the display panel DP, focusing on the display area DA. However, according to embodiments, at least one driving circuit part, lines, and/or pads, which are not illustrated, may be further disposed on the display panel DP.

Referring to FIG. 6, the display panel DP may include a base layer BSL and pixels provided on the base layer BSL. According to an embodiment, the pixels may include first pixels PXL1, second pixels PXL2, and/or third pixels PXL3. Hereinafter, at least one pixel among the first pixels PXL1, the second pixels PXL2, and the third pixels PXL3 may be arbitrarily referred to as "pixel PXL," or two or more types of pixels may be collectively referred to as "pixels PXL".

The display panel DP and the base layer BSL for forming the same may include a display area DA for displaying an image and a non-display area NA excluding the display area DA.

The display area DA may be disposed in a central area of the display panel DP, and the non-display area NA may be disposed in an edge area of the display panel DP to surround the display area DA. However, the positions of the display area DA and the non-display area NA may be changed. The display area DA may constitute a screen on which an image may be displayed, and the non-display area NA may be an area other than the display area DA.

The pixels PXL may be arranged in the display area DA on the base layer BSL. For example, the display area DA may include pixel areas in which each pixel PXL may be provided. The non-display area NA may be disposed around the display area DA, and various lines, pads, and/or a built-in circuit part connected to the pixels PXL of the display area DA may be disposed in the non-display area NA.

In the display area DA, the pixels PXL may be regularly arranged according to a stripe or pentile arrangement structure. The pixels PXL may be arranged in the display area DA in various structures and/or methods.

According to an embodiment, at least two types of pixels PXL emitting light of different colors may be disposed in the display area DA. For example, in the display area DA, first pixels PXL1 for emitting light of a first color, second pixels PXL2 for emitting light of a second color, and third pixels PXL3 for emitting light of a third color may be arranged. At least one first pixel PXL1, at least one second pixel PXL2, and at least one third pixel PXL3 adjacent to each other may constitute a pixel part PXU.

In the description of the embodiment, it may be assumed that three pixels PXL adjacent to each other constitute a pixel part PXU, but embodiments are not limited thereto. For example, the number, type, and/or mutual arrangement structure of the pixels PXL constituting each pixel part PXU may be variously changed according to embodiments.

According to an embodiment, the first pixel PXL1 may be a red pixel for emitting red light, the second pixel PXL2 may be a green pixel for emitting green light, and the third pixel PXL3 may be a blue pixel for emitting blue light. In an embodiment, the first pixel PXL1, the second pixel PXL2, and the third pixel PXL3 may have the light-emitting elements LD of a first color, a second color, and a third color, respectively, as a light source, thereby emitting the light of the first color, the second color, and the third color, respectively. In another embodiment, the first pixel PXL1, the second pixel PXL2, and the third pixel PXL3 may include the light-emitting elements LD that emit light of the same color and may include the light conversion layers having different colors disposed in each light-emitting area, thereby emitting the light of the first color, the second color, and the third color, respectively.

However, the color, type, and/or number of pixels PXL constituting each pixel part PXU are not limited to a particular color, type, and/or number. For example, the color of light emitted from each pixel PXL may be variously changed.

The pixel PXL may include at least one light source driven by a control signal (e.g., a scan signal and a data signal) and/or a power supply (e.g., a first power supply and a second power supply). In an embodiment, the light source may include at least one light-emitting element LD according to the embodiments of FIGS. 4 and 5, for example, at least one rod-shaped light-emitting element LD having a size to a degree of the nanoscale to the microscale. In addition, various types of light-emitting elements may be used as a light source of the pixel PXL. For example, in another embodiment, the light source of each pixel PXL may be composed of a light-emitting element having a core-shell structure.

Also, the pixel PXL may have a structure according to at least one of the embodiments to be described below. For example, each pixel PXL may have a structure to which an embodiment to be described below may be applied, or at least two embodiments may be applied in combination.

In an embodiment, the pixel PXL may be composed of an active pixel, but is not limited thereto. For example, the pixel PXL may be composed of a pixel of a passive or active type light-emitting display device having various structures and/or driving methods.

Figure 7:
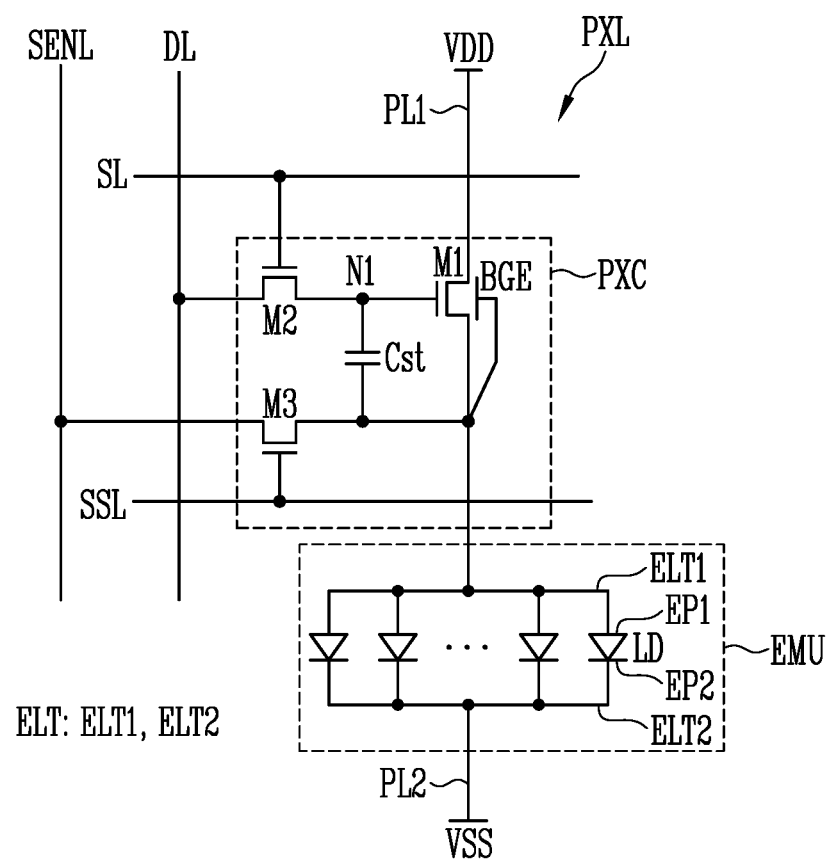
FIGS. 7 and 8 are schematic circuit diagrams illustrating a pixel according to an embodiment of the disclosure.
Figure 8:
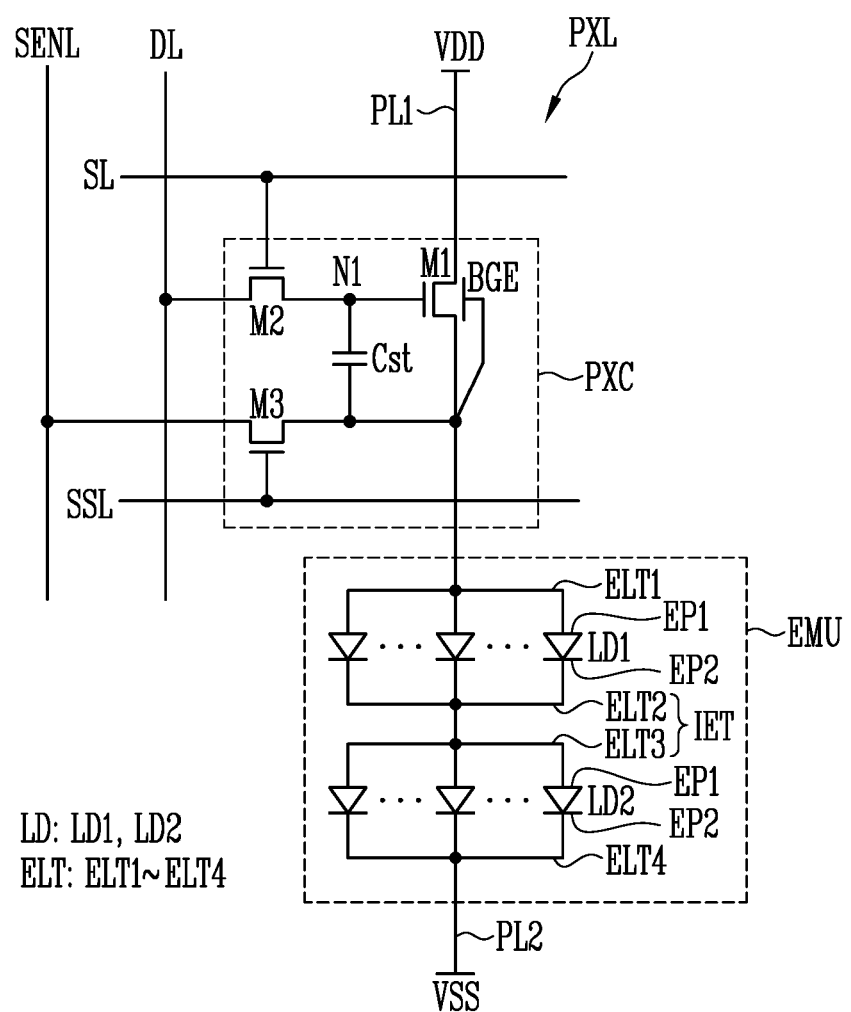

FIGS. 7 and 8 are circuit diagrams illustrating a pixel PXL according to an embodiment. For example, FIGS. 7 and 8 illustrate embodiments of a pixel PXL that can be applied to an active type light-emitting display device, and illustrate different embodiments with respect to the structure of the light-emitting part EMU.

According to an embodiment, each of the pixels PXL illustrated in FIGS. 7 and 8 may be one among a first pixel PXL1, a second pixel PXL2, and a third pixel PXL3 provided in the display panel DP of FIG. 6. In addition, the first pixel PXL1, the second pixel PXL2, and the third pixel PXL3 may have substantially the same or similar structure.

Referring to FIGS. 7 and 8, the pixel PXL may include a light-emitting part EMU for generating light with luminance corresponding to a data signal. The pixel PXL may further include a pixel circuit PXC for driving the light-emitting part EMU.

The pixel circuit PXC may be connected between a first power supply VDD and the light-emitting part EMU. The pixel circuit PXC may be connected to a scan line SL and a data line DL of the corresponding pixel PXL and may control the operation of the light-emitting part EMU in response to the scan signal and the data signal supplied from the scan line SL and the data line DL, respectively. The pixel circuit PXC may be selectively further connected to a sensing signal line SSL and a sensing line SENL.

The pixel circuit PXC may include at least one transistor and capacitor. For example, the pixel circuit PXC may include a first transistor M1, a second transistor M2, a third transistor M3, and a storage capacitor Cst.

The first transistor M1 may be connected between the first power supply VDD and a first electrode ELT1 of the light-emitting part EMU. A gate electrode of the first transistor M1 may be connected to a first node N1. The first transistor M1 may control a driving current supplied to the light-emitting part EMU in response to the voltage of the first node N1. For example, the first transistor M1 may be a driving transistor controlling a driving current of the pixel PXL.

In an embodiment, the first transistor M1 may include a back gate electrode BGE (or a bottom metal layer (BML)). The gate electrode and the back gate electrode BGE of the first transistor M1 may overlap each other with an insulating layer therebetween. The back gate electrode BGE may be connected to an electrode of the first transistor M1, for example, a source or drain electrode.

The second transistor M2 may be connected between the data line DL and the first node N1. The gate electrode of the second transistor M2 may be connected to the scan line SL. The second transistor M2 may be turned on in case that a scan signal of a gate-on voltage (e.g., high level voltage) is supplied from the scan line SL to connect electrically the data line DL and the first node N1.

In each frame period, a data signal of a corresponding frame may be supplied to the data line DL, and the data signal may be transferred to the node N1 through the second transistor M2 turned on during a period in case that a scan signal of a gate-on voltage is supplied. For example, the second transistor M2 may be a switching transistor for transferring each data signal to the inside of the pixel PXL.

An electrode of the storage capacitor Cst may be connected to the first node N1, and the other electrode may be connected to the second electrode of the first transistor M1. The storage capacitor Cst may charge a voltage corresponding to the data signal supplied to the first node N1 during each frame period.

The third transistor M3 may be connected between the first electrode ELT1 (or the second electrode of the first transistor M1) of the light-emitting part EMU and the sensing line SENL. The gate electrode of the third transistor M3 may be connected to the sensing signal line SSL. The third transistor M3 may transfer a voltage value applied to the first electrode ELT1 of the light-emitting part EMU to the sensing line SENL according to the sensing signal supplied to the sensing signal line SSL during a sensing period. The voltage value transferred through the sensing line SENL may be provided to an external circuit (e.g., timing controller), and the external circuit may extract characteristic information (e.g., the threshold voltage of the first transistor M1) of each pixel PXL based on the provided voltage value. The extracted characteristic information may be used to convert image data so that a characteristic deviation between the pixels PXL may be compensated for.

In FIGS. 7 and 8, transistors included in the pixel circuit PXC, for example, the first, second, and third transistors M1, M2, and M3 are all illustrated as N-type transistors, but embodiments are not limited thereto. For example, at least one among the first, second, and third transistors M1, M2, and M3 may be changed to a P-type transistor.

The structure and driving method of the pixel PXL may be variously changed. For example, the pixel circuit PXC may be composed of pixel circuits of various structures and/or driving methods in addition to the embodiments illustrated in FIGS. 7 and 8.

For example, the pixel circuit PXC may not include the third transistor M3. The pixel circuit PXC may further include other circuit elements such as a compensation transistor for compensating the threshold voltage of the first transistor M1, an initialization transistor for initializing a voltage of the first node N1 and/or the first electrode ELT1 of the light-emitting part EMU, a light-emitting control transistor for controlling a period in which the driving current may be supplied to the light-emitting part EMU, and/or a boosting capacitor for boosting the voltage of the first node N1.

In another embodiment, in case that the pixel PXL is a pixel of the passive light-emitting display device, the pixel circuit PXC may be omitted. The light-emitting part EMU may be directly connected to the scan line SL, the data line DL, a first power line PL1, a second power line PL2, and/or other signal lines or power lines.

The light-emitting part EMU may include at least one light-emitting element LD connected between the first power supply VDD and the second power supply VSS, for example, light-emitting elements LD.

For example, the light-emitting part EMU may include a first electrode ELT1 connected to the first power supply VDD via the pixel circuit PXC and the first power line PL1, a second electrode ELT2 connected to the second power supply VSS through the second power line PL2, and light-emitting elements LD connected between the first and second electrodes ELT1 and ELT2, as in the embodiment of FIG. 7. The first and second electrodes ELT1 and ELT2 may constitute pixel electrodes ELT of each pixel PXL.

The first power supply VDD and the second power supply VSS may have different potentials so that the light-emitting elements LD can emit light. For example, the first power supply VDD may be set as a high-potential power supply, and the second power supply VSS may be set as a low-potential power supply lower than the first power supply VDD by the threshold voltage or more of the light-emitting elements LD.

Each light-emitting element LD may include a first end EP1 (e.g., P-type end) connected to the first power supply VDD through the first electrode ELT1 and/or the pixel circuit PXC, and a second end EP2 (e.g., N-type end) connected to the second power supply VSS through the second electrode ELT2. For example, the light-emitting elements LD may be connected in parallel in a forward direction between the first and second electrodes ELT1 and ELT2.

Each of the light-emitting elements LD connected in the forward direction between the first power supply VDD and the second power supply VSS may include an effective light source. Such effective light sources may constitute the light-emitting part EMU of the pixel PXL.

FIG. 7 illustrates that an embodiment in which the pixel PXL may include the light-emitting part EMU having a parallel structure, but embodiments are not limited thereto. For example, the pixel PXL may include a light-emitting part EMU having a serial structure or a serial-parallel structure. For example, the light-emitting part EMU may include light-emitting elements LD connected to two serial stages as in the embodiment of FIG. 8.

Referring to FIG. 8, the light-emitting part EMU may include a first serial stage including the first and second electrodes ELT1 and ELT2 and at least one first light-emitting element LD1 connected in the forward direction between the first electrode ELT1 and the second electrode ELT2, and a second serial stage including the third and fourth electrodes ELT3 and ELT4 and at least one second light-emitting element LD2 connected in the forward direction between the third electrode ELT3 and the fourth electrode ELT4. The first to fourth electrodes ELT1 to ELT4 may form pixel electrodes ELT of each pixel PXL.

The first electrode of the light-emitting part EMU, for example, the first electrode ELT1 may be an anode electrode of the light-emitting part EMU. The last electrode of the light-emitting part EMU, for example, the fourth electrode ELT4 may be a cathode electrode of the light-emitting part EMU. Electrodes directly connected between the two serial stages of the light-emitting part EMU, for example, the second and third electrodes ELT2 and ELT3 may be integrally or non-integrally connected to each other to form an intermediate electrode IET. The second and third electrodes ELT2 and ELT3 may be regarded as an intermediate electrode IET by being integral with each other.

The number of serial stages constituting each light-emitting part EMU may be variously changed according to embodiments. For example, the light-emitting part EMU may include light-emitting elements LD connected to three or more serial stages.

Each serial stage may include a pair of pixel electrodes ELT and at least one light-emitting element LD connected between the pair of pixel electrodes ELT. The numbers of light-emitting elements LD constituting each serial stage may be the same as or different from each other, and the numbers of the light-emitting elements LD is not limited to a particular number.

FIGS. 7 and 8 illustrates an embodiment in which the light-emitting elements LD may be connected in a parallel or serial-parallel structure, but embodiments are not limited thereto. For example, in another embodiment, the light-emitting elements LD constituting the light-emitting part EMU of each pixel PXL may be connected to each other in series.

If the light-emitting part EMU is formed by using light-emitting elements LD of the same condition (e.g., the same size and/or number) as an effective light source, in case that the light-emitting elements LD are connected in a serial or serial-parallel structure, power efficiency may be increased. The pixel PXL in which the light-emitting elements LD may be connected in a serial or serial-parallel structure may express a certain degree of luminance through the light-emitting elements LD in remaining serial stages even if a short defect occurs in some serial stages, thereby reducing the possibility of dark spot defects in the pixel PXL.

Each light-emitting element LD may have a first end EP1 (e.g., P-type end) connected to the first power supply VDD via at least one pixel electrode ELT (e.g., first electrode ELT1), a pixel circuit PXC, and/or a first power line PL1, or the like, and a second end EP2 (e.g., N-type end) connected to the second power supply VSS via at least one other pixel electrode ELT (e.g., a second electrode ELT2 or a fourth electrode ELT4) and a second power line PL2 or the like. For example, the light-emitting elements LD may be connected in the forward direction between the first power supply VDD and the second power supply VSS. Each of the light-emitting elements LD connected in the forward direction may constitute an effective light source, and effective light sources may constitute a light-emitting part EMU of the pixel PXL.

In case that a driving current is supplied through the corresponding pixel circuit PXC, the light-emitting elements LD may emit light with luminance corresponding to the driving current. For example, during each frame period, the pixel circuit PXC may supply a driving current corresponding to a gray scale value to be expressed in the corresponding frame to the light-emitting part EMU. Therefore, while the light-emitting elements LD emit light with luminance corresponding to the driving current, the light-emitting part EMU can express luminance corresponding to the driving current.

In an embodiment, the light-emitting part EMU may further include at least one non-effective light source in addition to the light-emitting elements LD constituting each effective light source. For example, at least one non-effective light-emitting element arranged in a reverse direction or with at least one floating end may be further connected to at least one serial stage. The non-effective light-emitting element may maintain an inactive state even in case that a forward driving voltage is applied between the pixel electrodes ELT, and thus may substantially maintain a non-emission state.

Figure 9:
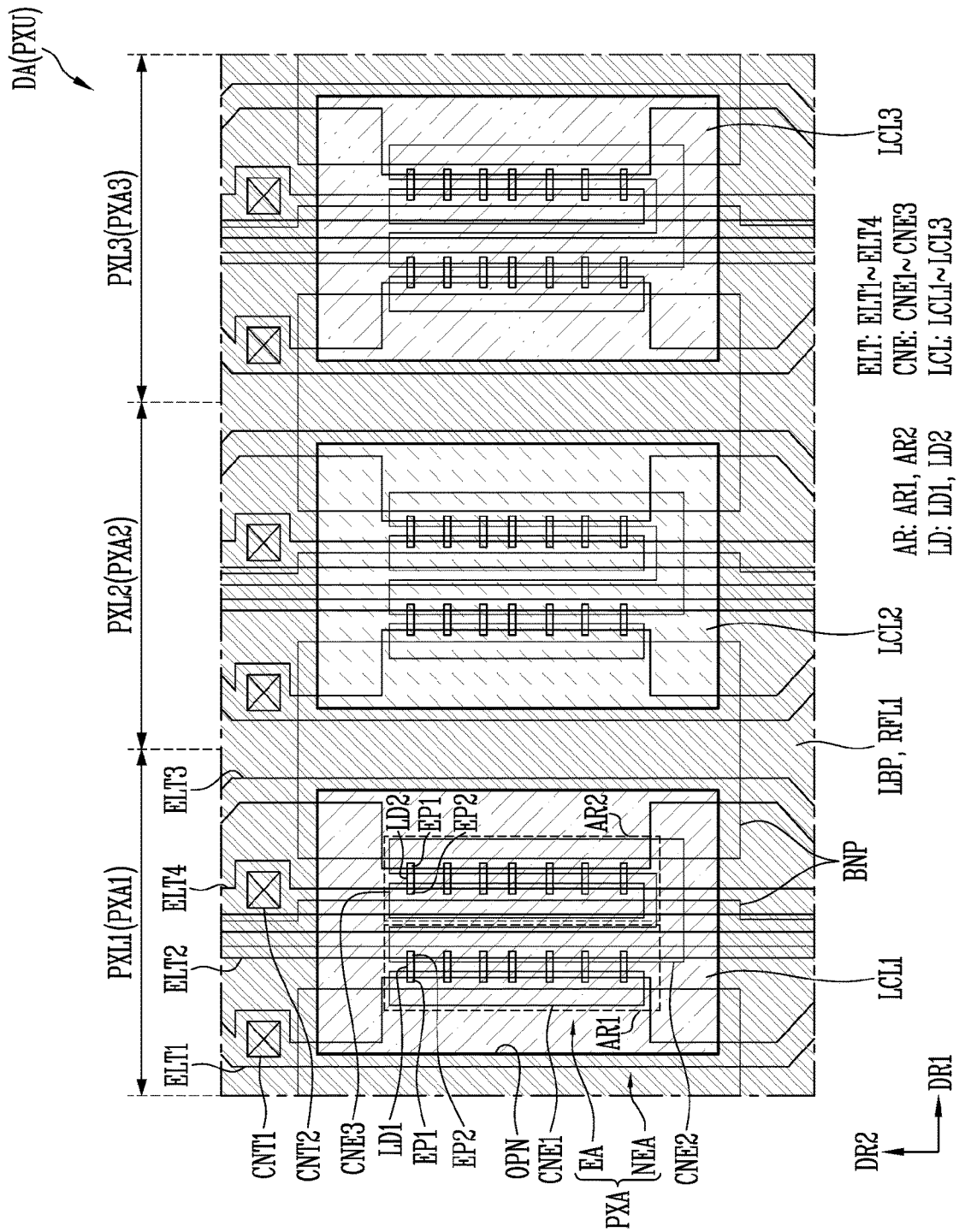
FIG. 9 is a schematic plan view illustrating a display area according to an embodiment of the disclosure.

FIG. 9 is a schematic plan view illustrating a display area DA according to an embodiment. For example, FIG. 9 illustrates a structure of the display area DA, focusing on first to third pixel areas PXA1, PXA2, and PXA3 in which the first to third pixels PXL1, PXL2, and PXL3, disposed adjacent to each other in the display area DA to form a pixel part PXU, are disposed, first to third light conversion layers LCL1, LCL2, and LCL3 respectively disposed on the first to third pixels PXL1, PXL2, and PXL3, a light blocking layer LBP, and a first reflective layer RFL1.

FIG. 9 illustrates that an embodiment in which each of the first, second, and third pixels PXL1, PXL2, and PXL3 includes a light-emitting part EMU having a serial-parallel structure of a two-stage as in the embodiment of FIG. 8, but embodiments are not limited thereto. FIG. 9 illustrates that a structure of the first, second, and third pixels PXL1, PXL2, and PXL3, focusing on the light-emitting parts EMU of the first, second, and third pixels PXL1, PXL2, and PXL3. According to an embodiment, the first, second, and third pixels PXL1, PXL2, and PXL3 may have substantially the same or similar structure.

Referring to FIGS. 6 to 9, each of the first, second, and third pixels PXL1, PXL2, and PXL3 may include a light-emitting area EA provided in a first pixel area PXA1, a second pixel area PXA2, and a third pixel areaPXA3.

Hereinafter, at least one among the first, second, and third pixels PXL1, PXL2, and PXL3 is arbitrarily referred to as, or the first, second, and third pixels PXL1, PXL2, and PXL3 are collectively referred to as "pixel PXL" or "pixels PXL." Similarly, at least one among the first, second, and third pixel areas PXA1, PXA2, and PXA3 in which the first, second and third pixels PXL1, PXL2, and PXL3 are respectively provided, is arbitrarily referred to as, or the first, second, and third pixel areas PXA1, PXA2, and PXA3 are collectively referred to as "pixel area PXA" or "pixel areas PXA".

FIG. 9 illustrates that an embodiment in which each pixel area PXA in which each pixel PXL may be disposed may have a rectangular plate shape, and extending directions of a short side and a long side of each pixel area PXA will be referred to as the first direction DR1 and the second direction DR2. However, this may be changed according to the size and/or shape of the pixel area PXA.

Each pixel PXL may include light-emitting element array areas AR corresponding to each serial stage of the light-emitting part EMU. For example, the pixel PXL may include a first light-emitting element array area AR1 corresponding to the first serial stage and a second light-emitting element array area AR2 corresponding to the second serial stage.

In each pixel area PXA, an area including at least one light-emitting element array area AR may constitute a light-emitting area EA of the corresponding pixel PXL. In each pixel area PXA, remaining areas except for the light-emitting area EA may be a non-light-emitting area NEA. According to an embodiment, the non-light-emitting area NEA may be disposed around the light-emitting area EA so as to surround the light-emitting area EA.

For example, the pixel area PXA may include a light-emitting area EA capable of emitting light by including the light-emitting elements LD, and a non-light-emitting area NEA except for the light-emitting area EA. The light-emitting area EA may include at least one light-emitting element array area AR corresponding to at least one serial stage.

Each light-emitting element array area AR may include at least one pair of pixel electrodes ELT and at least one light-emitting element LD connected between the pixel electrodes ELT. For example, the first light-emitting element array area AR1 may be an area corresponding to the first serial stage and may include the first electrode ELT1 and the second electrode ELT2 and at least one first light-emitting element LD1 connected between the first and second electrodes ELT1 and ELT2. Similarly, the second light-emitting element array area AR2 may be an area corresponding to the second serial stage and may include the third electrode ELT3 and the fourth electrode ELT4 and at least one second light-emitting element LD2 connected between the third and fourth electrodes ELT3 and ELT4.

Each of the light-emitting element array areas AR may stably connect each pixel electrode ELT to the adjacent light-emitting elements LD, and/or may further include contact electrodes CNE for connecting two consecutive serial stages. In the description of the embodiment, the first and second electrodes ELT1 and ELT2 and the third and fourth electrodes ELT3 and ELT4 will be defined as pixel electrodes ELT, and the contact electrodes CNE will be described as a separate component from the pixel electrodes ELT. The invention, however, is not limited thereto. For example, pixel electrodes ELT may be regarded as a representative of the first and second electrodes ELT1 and ELT2, the third and fourth electrodes ELT3 and ELT4, and the contact electrodes CNE.

According to an embodiment, the first and second light-emitting element array areas AR1 and AR2 may have substantially the same or similar structure, but are not limited thereto. The number of light-emitting elements LD, the shape of the pixel electrodes ELT and/or the contact electrodes CNE, or the like disposed in the first and second light-emitting element array areas AR1 and AR2 may be the same as or different from each other.

In case that the structure of the pixel PXL is described in a more general perspective, the pixel PXL may include pixel electrodes ELT formed in the corresponding pixel area PXA, the light-emitting elements LD arranged between the pixel electrodes ELT in each light-emitting element array area AR, and the contact electrodes CNE for stably connecting the light-emitting elements LD between the pixel electrodes ELT.

The pixel PXL may further include a bank pattern BNP disposed under the pixel electrodes ELT. The bank pattern BNP may be formed as a separate or integral pattern.

The pixel PXL may selectively further include a light-blocking bank (not illustrated) surrounding each light-emitting area EA. For example, the pixel PXL may further include a light-blocking bank disposed in the non-light-emitting area NEA so as to overlap the light blocking layer LBP and the first reflective layer RFL1.

According to the embodiment, the bank pattern BNP, the pixel electrodes ELT, the light-emitting elements LD, and the contact electrodes CNE may be sequentially disposed on a surface of the base layer BSL having the pixels PXL. Detailed descriptions of the cross-sectional structure of the pixel PXL will be described below.

The bank pattern BNP may be disposed under the pixel electrodes ELT so as to overlap a region of each of the pixel electrodes ELT. The bank pattern BNP may be formed as a separate or integral pattern.

For example, the bank pattern BNP may be composed of separate patterns provided individually under each pixel electrode ELT or may be composed of patterns commonly overlapping at least two adjacent pixel electrodes ELT. As another example, the bank pattern BNP may be formed as an integral pattern integrally connected over the entire display area DA.

A wall structure may be formed around the light-emitting elements LD by the bank pattern BNP. Specifically, since the bank pattern BNP may be disposed under a region of each of the pixel electrodes ELT, the pixel electrodes ELT may protrude upward in the region where the bank pattern BNP may be formed. Therefore, the bank pattern BNP may form a reflective wall structure together with the pixel electrodes ELT. For example, the pixel electrodes ELT and/or the bank pattern BNP may be formed of a reflective material, or at least one reflective layer having reflectivity may be formed on the pixel electrodes ELT and/or protruding sidewalls of the bank pattern BNP. Therefore, the light emitted from the first and second ends EP1 and EP2 of the light-emitting elements LD facing the pixel electrodes ELT may be guided in the front direction of the display panel DP. As described above, in case that a region of the pixel electrodes ELT protrudes upward by using the bank pattern BNP, light efficiency of the pixels PXL can be increased.

The pixel electrodes ELT may include at least a pair of electrodes disposed in each light-emitting element array area AR. For example, the pixel electrodes ELT may include a first electrode ELT1 and a second electrode ELT2 facing each other in the first light-emitting element array area AR1, and a third electrode ELT3 and a fourth electrode ELT4 facing each other in the second light-emitting element array area AR2.

The pixel electrodes ELT may be spaced apart from each other in the first direction DR1 in each light-emitting area EA, and each thereof may extend in the second direction DR2. In an embodiment, the first direction DR1 may be a row direction (or horizontal direction) of the display area DA, and the second direction DR2 may be a column direction (or vertical direction) of the display area DA, but is not limited thereto.

In each pixel area PXA, the pixel electrodes ELT may have a uniform or non-uniform width, and may or may not include a curved portion. For example, the shape and/or mutual arrangement structure of each of the pixel electrodes ELT may be variously changed according to embodiments.

In the entire display area DA, some of the pixel electrodes ELT may be first formed as an alignment line, and may be disconnected in a region (e.g., an upper area and/or lower area of each pixel area PXA) between the adjacent pixels PXL and divided into each pixel electrode ELT. Therefore, while reducing the number of alignment signals for aligning the light-emitting elements LD in each light-emitting area EA, the pixel electrodes ELT can be divided to be individually driven.

A pair of pixel electrodes ELT constituting each serial stage may be disposed at a close distance to each other in each light-emitting element array area AR, and may be disposed at a relatively far distance to each other in the remaining areas. For example, a pair of pixel electrodes ELT may face each other with a relatively narrow gap in each light-emitting element array area AR and may face each other with a relatively wide gap in the non-light-emitting area NEA. To this end, at least one pixel electrode ELT may be curved, or may have a different width in each area.

Therefore, in supplying and aligning the light-emitting elements LD in each pixel area PXA, the light-emitting elements LD may be disposed in a desired area. For example, in case that applying an alignment signal to the pixel electrodes ELT (or alignment lines before being divided into the pixel electrodes ELT) to align the light-emitting elements LD in each pixel area PXA, a stronger electric field may be generated in the light-emitting element array areas AR where the distance between the pixel electrodes ELT may be close, and the light-emitting elements LD may be disposed inside the light-emitting element array areas AR.

One of the pixel electrodes ELT of each pixel PXL, for example, the first electrode ELT1 may be connected to the pixel circuit PXC and/or the first power line PL1 through a first contact portion CNT1. Another one of the pixel electrodes ELT of each pixel PXL, for example, the fourth electrode ELT4 may be connected to the second power line PL2 through a second contact portion CNT2.

In an embodiment, the pixel electrodes ELT may be connected to the light-emitting elements LD through the contact electrodes CNE. For example, each pixel electrode ELT may be connected to the first end EP1 or the second end EP2 of at least one adjacent light-emitting element LD through each contact electrode CNE.

The light-emitting elements LD may be divided and disposed in each light-emitting element array area AR. The light-emitting elements LD may be disposed between a pair of pixel electrodes ELT disposed in each light-emitting element array area AR. Here, that the disposing of the light-emitting elements LD between the pair of pixel electrodes ELT may mean that at least one region of the light-emitting elements LD may be disposed in a region between the pair of pixel electrodes ELT and/or an upper/lower region thereof.

For example, the light-emitting elements LD may include first and second light-emitting elements LD1 and LD2 divided and arranged in the first and second light-emitting element array areas AR1 and AR2. The first light-emitting elements LD1 may be arranged and connected between the first and second electrodes ELT1 and ELT2, and the second light-emitting elements LD2 may be arranged and connected between the third and fourth electrodes ELT3 and ELT4.

In an embodiment, the light-emitting elements LD may be connected to each pixel electrode ELT by each contact electrode CNE. The light-emitting elements LD disposed in two consecutive serial stages may be connected in series to each other by at least one contact electrode CNE.

For example, the pixel PXL may include contact electrodes CNE disposed on each pixel electrode ELT and connecting the first or second ends EP1 and EP2 of at least one light-emitting element LD adjacent to the pixel electrode ELT to the corresponding pixel electrode ELT. For example, the pixel PXL may include first to third contact electrodes CNE1 to CNE3.

The first contact electrode CNE1 may be disposed on the first ends EP1 of the first light-emitting elements LD1 and the first electrode ELT1. The first contact electrode CNE1 may connect the first ends EP1 of the first light-emitting elements LD1 to the first electrode ELT1.

The second contact electrode CNE2 may be disposed on the second ends EP2 of the first light-emitting elements LD1 and the second electrode ELT2 and may connect the second ends EP2 of the first light-emitting elements LD1 to the second electrode ELT2. The second contact electrode CNE2 may be also disposed on the first ends EP1 of the second light-emitting elements LD2 and the third electrode ELT3 and may connect the first ends EP1 of the second light-emitting elements LD2 to the third electrode ELT3.

To this end, the second contact electrode CNE2 may extend from the first light-emitting element array area AR1 to the second light-emitting element array area AR2 and may connect the second electrode ELT2 to the third electrode ELT3. In another embodiment, the second contact electrode CNE2 may be composed of separable electrodes disposed in each of the first and second light-emitting element array areas AR1 and AR2, and the separable electrodes may be connected to each other through a bridge pattern or the like. The first serial stage and the second serial stage may be connected by the second contact electrode CNE2.

The third contact electrode CNE3 may be disposed on the second ends EP2 of the second light-emitting elements LD2 and the fourth electrode ELT4 and may connect the second ends EP2 of the second light-emitting elements LD2 to the fourth electrode ELT4.

As described above, the pixel electrodes ELT and the light-emitting elements LD may be connected in a desired shape using the contact electrodes CNE. For example, the first light-emitting elements LD1 and the second light-emitting elements LD2 may be connected in series using the contact electrodes CNE.

By adjusting an alignment signal for aligning the light-emitting elements LD or forming a magnetic field to increase a utilization rate of the light-emitting elements LD supplied to each light-emitting element array area AR, the light-emitting elements LD may be biased and aligned so that a larger number (or ratio) of the light-emitting elements LD may be aligned in a specific direction in the light-emitting element array area AR. It may be possible to connect the pixel electrodes ELT according to an arrangement direction of more light-emitting elements LD using the contact electrodes CNE. Therefore, it may be possible to increase the utilization rate of the light-emitting elements LD and increase the light efficiency of the pixel PXL.

For example, a first alignment signal may be applied to first and second alignment lines (e.g., alignment lines corresponding to the first and third electrodes ELT1 and ELT3) disposed in first and second side areas (e.g., left and right areas) disposed on sides of each pixel area PXA in the first direction DR1, and a second alignment signal may be applied to the third alignment line(s) (e.g., alignment lines corresponding to the second and fourth electrodes ELT2 and ELT4) disposed in a central area between the first and second side areas. The light-emitting elements LD may be biased and aligned so that the first ends EP1 of the first light-emitting elements LD1 may be directed toward a first alignment line (e.g., an alignment line divided into the first electrode ELT1), and the first ends EP1 of the second light-emitting elements LD2 may be directed toward a second alignment line (e.g., an alignment line divided into the third electrode ELT3).

Hereinafter, the alignment lines may be cut between adjacent pixels PXL in the first and/or second directions DR1 and DR2 to be divided into each pixel electrode ELT, and the pixel electrodes ELT and the light-emitting elements LD may be connected in a desired direction using the contact electrodes CNE. For example, the pixel electrodes ELT of the adjacent pixels PXL in the second direction DR2 may be separated from each other.

In an embodiment, an electrode disposed in a first side area (e.g., left area) of each pixel area PXA may be formed as a first electrode ELT1, and an electrode disposed in a second side area (e.g., right area) of the pixel area PXA may be formed as a third electrode ELT3. An electrode disposed in the first light-emitting element array area AR1 to face the first electrode ELT1 may be formed as a second electrode ELT2, and an electrode disposed in the second light-emitting element array area AR2 to face the third electrode ELT3 may be formed as a fourth electrode ELT4.

Each contact electrode CNE may be formed directly on the first or second ends EP1 and EP2 of the adjacent light-emitting elements LD, so that each contact electrode CNE may be connected to the first or second ends EP1 or EP2 of the light-emitting elements LD. Each contact electrode CNE may be connected to the pixel electrode(s) ELT by being formed directly on each pixel electrode(s) ELT, or may be connected to each of the pixel electrodes ELT through at least one contact hole and/or a bridge pattern.

The light conversion layer LCL, the light blocking layer LBP (also referred to as "light blocking pattern," "black matrix pattern," or "black matrix wall"), and the first reflective layer RFL1 may be disposed on the pixels PXL. The light conversion layer LCL may include first, second, and third light conversion layers LCL1, LCL2, and LCL3 corresponding (e.g., overlapping) to the light-emitting areas EA of each of the first, second, and third pixels PXL1, PXL2, and PXL3. The light blocking layer LBP and the first reflective layer RFL1 may correspond (e.g., overlap) to the non-light-emitting area NEA of the pixels PXL.

In the description of embodiments, the light conversion layer LCL will be described as a separate component from the pixels PXL. The embodiments, however, are not limited thereto. For example, it may be considered that the pixels PXL include each light conversion layer LCL. For example, it may be considered that the first, second, and third pixels PXL1, PXL2, and PXL3 include first, second, and third light conversion layers LCL1, LCL2, and LCL3, respectively.

In an embodiment, the first, second, and third pixels PXL1, PXL2, and PXL3 may include light-emitting elements LD emitting light of the same color. For example, the first, second, and third pixels PXL1, PXL2, and PXL3 may include blue light-emitting elements emitting blue light.

In case that the first, second, and third pixels PXL1, PXL2, and PXL3 include light-emitting elements LD emitting light of the same color, and the first, second and third pixels PXL1, PXL2, and PXL3 may be set as pixels of different colors, at least one among the first, second, and third light conversion layers LCL1, LCL2, and LCL3 may include color conversion particles converting light, emitted from the light-emitting elements LD, into light of different colors. In case that at least one pixel PXL among the first, second, and third pixels PXL1, PXL2, and PXL3 includes light-emitting elements LD emitting light having the same color as that of the corresponding pixel PXL, the light conversion layer LCL may include light scattering particles on the at least one pixel PXL.

The light blocking layer LBP and the first reflective layer RFL1 may have openings OPN corresponding to each of the light-emitting areas EA and may surround the light-emitting areas EA at least when viewed in a plan view. The arrangement structure and materials of the light blocking layer LBP and the first reflective layer RFL1 will be described below with reference to cross-sectional views of FIGS. 11 to 26.

Figure 10:
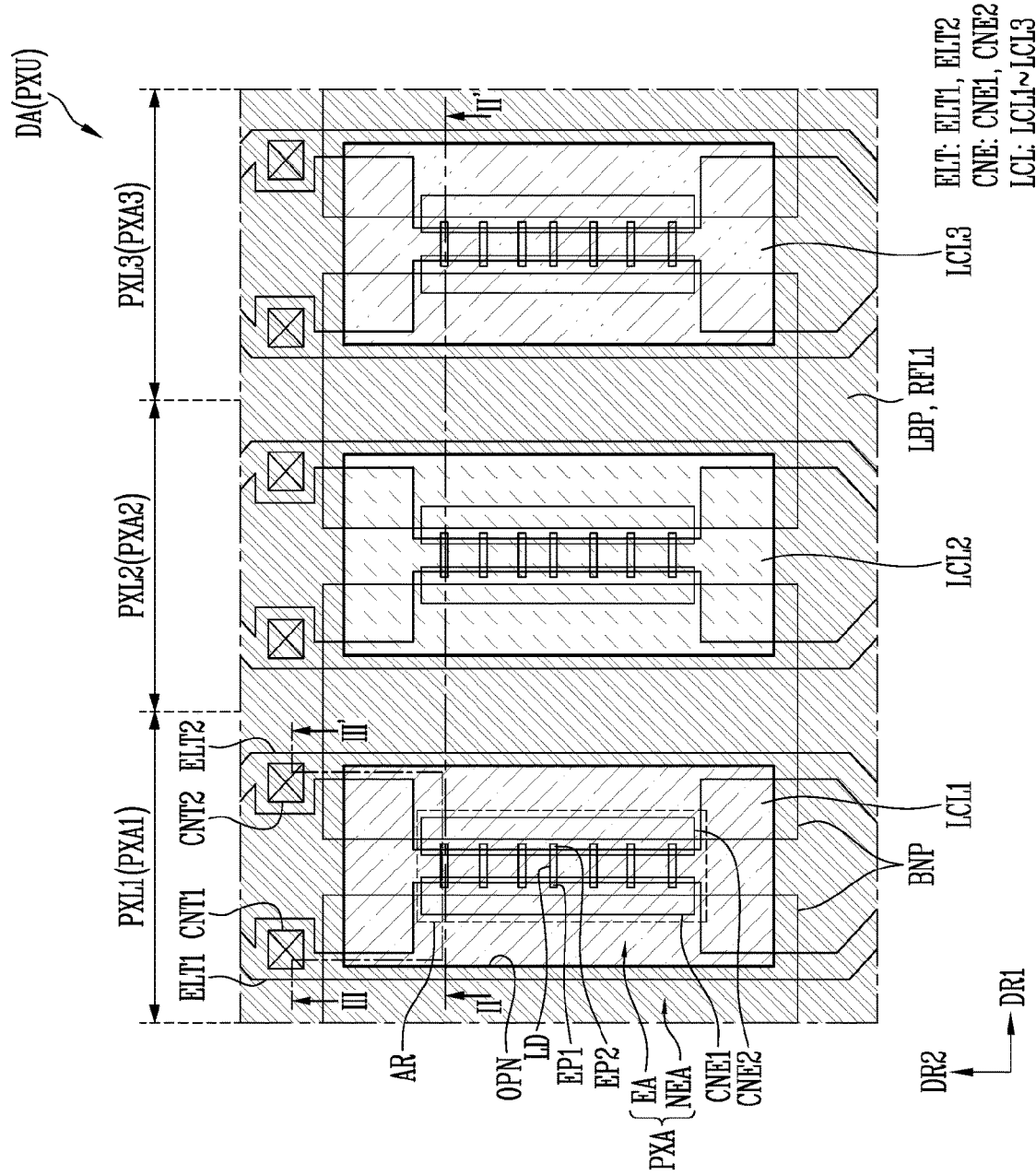
FIG. 10 is a schematic plan view illustrating a display area according to an embodiment of the disclosure.

FIG. 10 is a schematic plan view illustrating a display area DA according to an embodiment. For example, FIG. 10 illustrates a modified embodiment of the embodiment of FIG. 9 in relation to the configuration of the light-emitting part EMU.

Referring to FIG. 10, the light-emitting part EMU may be composed of a series structure (for example, parallel structure) of a single-stage corresponding to the embodiment of FIG. 7. Each pixel area PXA may include a single light-emitting element array area AR or light-emitting element array areas AR.

For example, in the embodiment of FIG. 9, the first and third electrodes ELT1 and ELT3 may be connected to electrically form an electrode (e.g., first electrode ELT1), and/or the second and fourth electrodes ELT2 and ELT4 may be connected to electrically form an electrode (e.g., second electrode ELT2). As another example, two pixel electrodes ELT may be formed in the light-emitting area EA of each pixel PXL.

For example, as illustrated in FIG. 10, the first electrode ELT1 and the second electrode ELT2 facing each other may be disposed in each light-emitting area EA. The first and second electrodes ELT1 and ELT2 may be connected to the pixel circuit layer PCL through first and second contact portions CNT1 and CNT2, respectively.

Each pixel area PXA may include a single light-emitting element array area AR. The contact electrodes CNE may include a first contact electrode CNE1 and a second contact electrode CNE2 disposed on the first electrode ELT1 and the second electrode ELT2, respectively.

In an embodiment, each pixel PXL may include a single light-emitting element LD provided in a single light-emitting element array area AR. In another embodiment, each pixel PXL may include light-emitting elements LD provided in the single light-emitting element array area AR.

For example, the number of light-emitting element(s) LD provided in each pixel PXL is not limited to a particular number. However, for convenience of description, it may be assumed in the following embodiments that each pixel PXL may include light-emitting elements LD.

Figure 11:
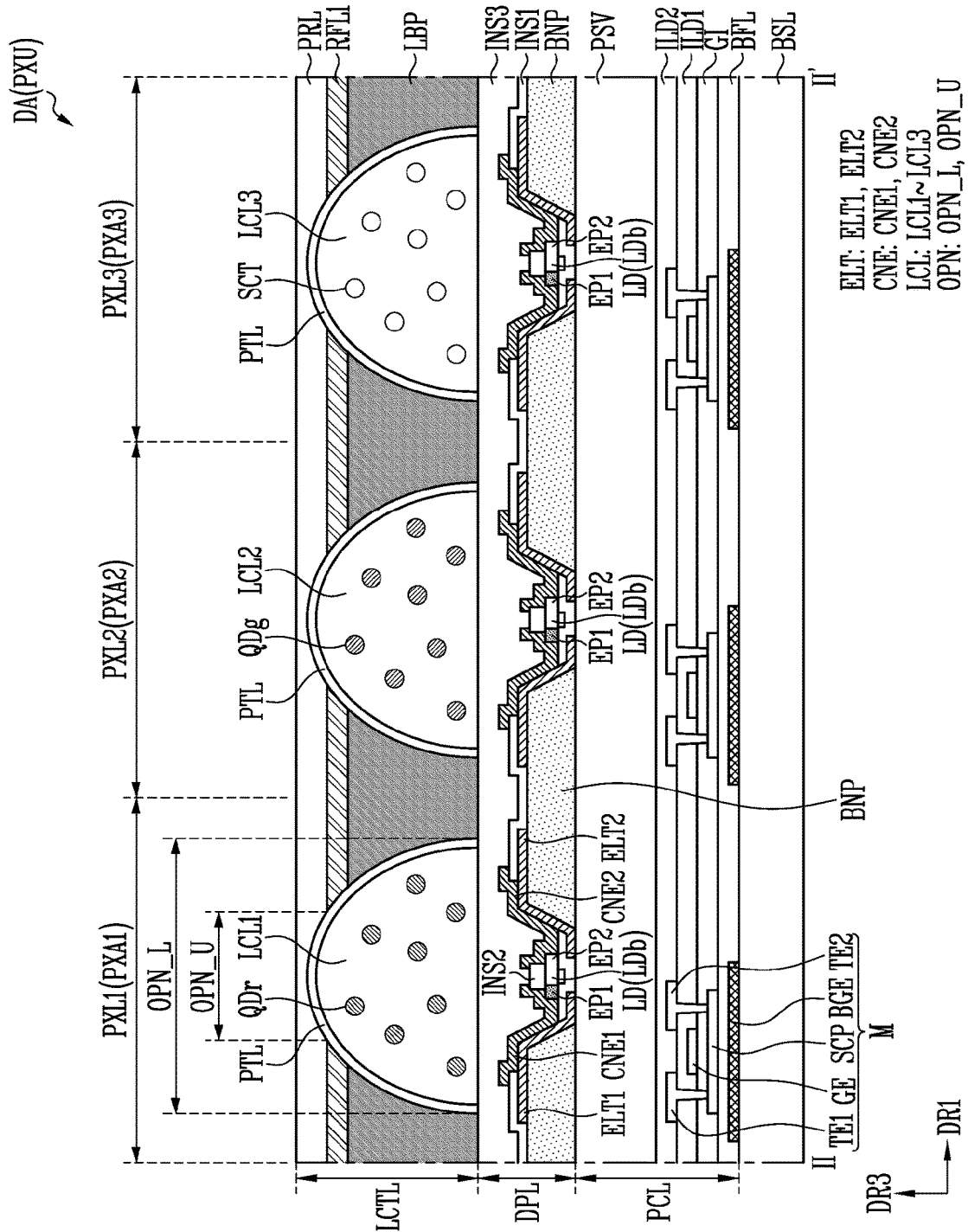
FIGS. 11 and 12 are schematic cross-sectional views illustrating a display area according to an embodiment of the disclosure.
Figure 12:
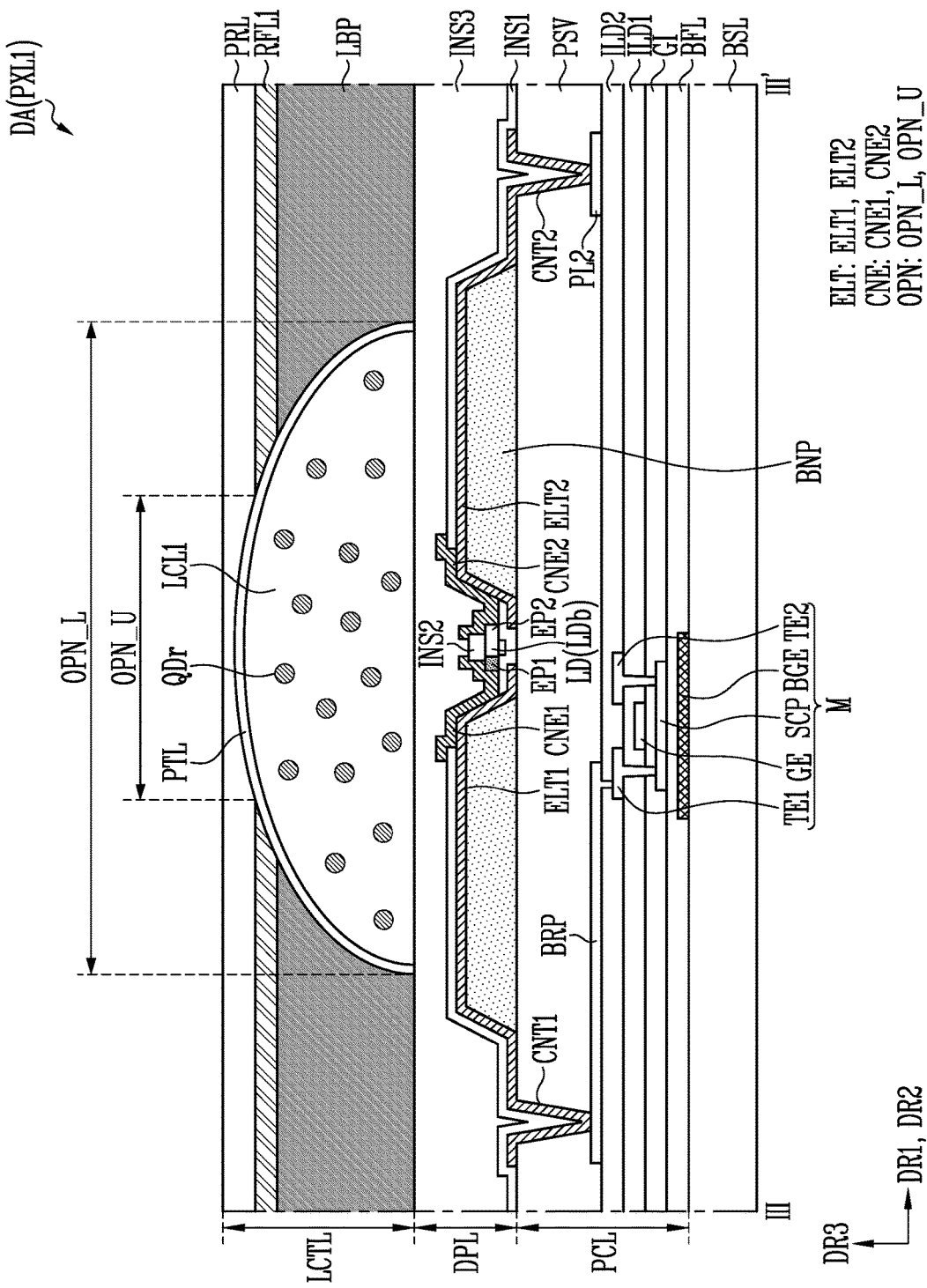

FIGS. 11 and 12 are schematic cross-sectional views illustrating a display area DA according to an embodiment. For example, FIG. 11 illustrates an example of a cross section taken along line II-II' of FIG. 10, and FIG. 12 illustrates an example of a cross section taken along line III-III' of FIG. 10.

In FIGS. 11 and 12, an arbitrary transistor M (e.g., a first transistor M1 connected to the first electrode ELT1 through a first contact portion CNT1 and a bridge pattern BRP and including the back gate electrode BGE) will be illustrated as examples of circuit elements that may be disposed on the pixel circuit layer PCL. In an embodiment, the back gate electrode BGE may be connected to the source or drain electrode of the corresponding transistor M (e.g., first transistor M1). For example, as illustrated in FIGS. 7 and 8, the back gate electrode BGE of the first transistor M1 may be connected to the source electrode (or drain electrode) of the first transistor M1, and thus the threshold voltage of the first transistor M1 may be changed by applying a source-sink (or drain-sink) technology. A second power line PL2 connected to the second electrode ELT2 through the second contact portion CNT2 will be illustrated as example of a line that may be disposed on the pixel circuit layer PCL. Various circuit elements constituting the pixel circuit PXC of the corresponding pixel PXL and/or lines connected thereto may be disposed in each pixel area PXA of the pixel circuit layer PCL and/or a peripheral area thereof.

Referring to FIGS. 11 and 12, the pixels PXL and the display panel DP including the same according to an embodiment may include the pixel circuit layer PCL and the display element layer DPL overlapping each other on a surface of the base layer BSL. For example, the display area DA may include the pixel circuit layer PCL disposed on the surface of the base layer BSL and the display element layer DPL disposed on the pixel circuit layer PCL.

The display panel DP according to an embodiment may further include a light control layer LCTL disposed on the pixels PXL. The light control layer LCTL may be provided at least in the display area DA.

Circuit elements constituting the pixel circuit PXC of the corresponding pixel PXL and lines connected thereto may be disposed in each pixel area PXA of the pixel circuit layer PCL. For example, the pixel circuit layer PCL may include transistors M and a storage capacitor Cst that may be disposed in each pixel area PXA and constitute the pixel circuit PXC of the pixel PXL. The pixel circuit layer PCL may further include at least one power line and/or signal line connected to each of the pixel circuits PXC and/or the light-emitting part EMU. For example, the pixel circuit layer PCL may include signal lines including a first power line PL1, a second power line PL2, scan lines SL, and data lines DL.

The pixel circuit layer PCL may include insulating layers in addition to circuit elements and lines. For example, the pixel circuit layer PCL may include a buffer layer BFL, a gate insulating layer GI, a first interlayer insulating layer ILD1, and a second interlayer insulating layer ILD2, and/or a passivation layer PSV sequentially stacked on the surface of the base layer BSL. According to an embodiment, the passivation layer PSV may be formed entirely on the display area DA to cover circuit elements of each pixel PXL and lines connected thereto, but is not limited thereto.

The pixel circuit layer PCL may further include a first conductive layer including at least one light blocking layer (or the back gate electrode BGE of the transistor M) disposed under at least some of the transistors M. The back gate electrode BGE may be connected to the source or drain electrode of the corresponding transistor M (e.g., first transistor M1).

The buffer layer BFL may be disposed on the surface of the base layer BSL having the first conductive layer selectively formed thereon. The buffer layer BFL may prevent an impurity from diffusing into each circuit element.

A semiconductor layer may be provided on the buffer layer BFL. The semiconductor layer may include a semiconductor pattern SCP of each transistor M. The semiconductor pattern SCP may include a channel region overlapping a gate electrode GE, and first and second conductive regions (e.g., source and drain regions) disposed on sides of the channel region.

According to an embodiment, the semiconductor pattern SCP may be a semiconductor pattern made of polysilicon, amorphous silicon, oxide semiconductor, or the like, or a combination thereof. The channel region of the semiconductor pattern SCP may be a semiconductor pattern not doped with impurities and may be an intrinsic semiconductor, and each of the first and second regions of the semiconductor pattern SCP may be a semiconductor pattern doped with impurities.

In an embodiment, the semiconductor patterns SCP of the transistors M constituting each pixel circuit PXC may be made of substantially the same or similar material. For example, each of the semiconductor pattern SCP of the transistors M may be made of the same material among polysilicon, amorphous silicon, and oxide semiconductor.

In another embodiment, some of the transistors M and the others of the transistors M may include semiconductor patterns SCP made of different materials. For example, the semiconductor pattern SCP of some of the transistors M may be made of polysilicon or amorphous silicon, and the semiconductor pattern SCP of the others of the transistors M may be made of oxide semiconductor.

The gate insulating layer GI may be disposed on the semiconductor layer. The second conductive layer may be provided on the gate insulating layer GI.

The second conductive layer may include the gate electrode GE of each transistor M. The gate electrode GE may overlap each semiconductor pattern SCP with the gate insulating layer GI interposed therebetween. The second conductive layer may further include an electrode of the storage capacitor Cst and/or a line (e.g., scan line SL).

The first interlayer insulating layer ILD1 may be disposed on the second conductive layer. A third conductive layer may be provided on the first interlayer insulating layer ILD1.

The third conductive layer may include first and second transistor electrodes TE1 and TE2 of each transistor M. Here, the first and second transistor electrodes TE1 and TE2 may be source and drain electrodes. The third conductive layer may further include an electrode of the storage capacitor Cst and/or a line (e.g., data line DL).

The second interlayer insulating layer ILD2 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may be formed of a single or multiple layers and may include at least one inorganic and/or organic insulating material. For example, each of the buffer layer BFL, the gate insulating layer GI, the first interlayer insulating layer ILD1, and the second interlayer insulating layer ILD2 may include various types of organic and inorganic insulating materials including silicon nitride ($SiN_x$), silicon oxide ($SiO_x$), silicon oxynitride ($SiOxN_y$), or a combination thereof.

The fourth conductive layer may include the bridge pattern BRP connecting the pixel circuit layer PCL and the display element layer DPL and/or a line (e.g., the first power line PL1 and/or the second power line PL2). The bridge pattern BRP may be connected to the first pixel electrode (e.g., the first electrode ELT1) of the light-emitting part EMU through the first contact portion CNT1. The second power line PL2 may be connected to the last pixel electrode (e.g., second electrode ELT2) of the light-emitting part EMU through the second contact portion CNT2.

Each of the conductive patterns, electrodes, and/or lines constituting the first to fourth conductive layers may have conductivity by including at least one conductive material, and the material thereof is not limited to a particular material. For example, each of the conductive patterns, electrodes, and/or lines constituting the first to fourth conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but are not limited thereto.

A passivation layer PSV may be disposed on the fourth conductive layer. In an embodiment, the passivation layer PSV may include at least one organic layer, but is not limited thereto.

The passivation layer PSV may be composed of a single or multiple layers and may include at least one inorganic and/or organic insulating material. For example, the passivation layer PSV may include at least one layer of an organic insulating layer and may substantially planarize the surface of the pixel circuit layer PCL. In an embodiment, the organic insulating layer may include at least one of polyacrylates resin, epoxy resin, phenolic resin, polyamides resin, polyimides resin, unsaturated polyesters resin, poly-phenylen ethers resin, poly-phenylene sulfides resin, and benzocyclobutene resin, but is not limited thereto.

A display element layer DPL may be disposed on the passivation layer PSV. The display element layer DPL may include the light-emitting part EMU of each pixel PXL. The light-emitting part EMU may be connected to a pixel circuit PXC of the pixel PXL and/or a power line (for example, second power line (PL2)) through at least one contact portion (for example, first and second contact portions CNT1 and CNT2) penetrating the passivation layer PSV. Each contact portion may be formed as at least one contact hole or at least one via hole, but is not limited thereto.

In each pixel area PXA of the display element layer DPL, pixel electrodes ELT, light-emitting elements LD, and contact electrodes CNE constituting the light-emitting part EMU of the pixel PXL may be disposed. For example, the display element layer DPL may include at least one pair of pixel electrodes ELT (e.g., first and second electrodes ELT1 and ELT2) disposed in the light-emitting element array area AR of each pixel PXL, light-emitting elements LD connected in series, parallel, or serial-parallel between the pixel electrodes ELT, and contact electrodes CNE (e.g., first and second contact electrodes CNE1 and CNE2) connecting the pixel electrodes ELT to the light-emitting elements LD.

The display element layer DPL may selectively further include a bank pattern BNP for protruding a region of the pixel electrodes ELT upward. The display element layer DPL may further include at least one conductive layer and/or insulating layer.

For example, the display element layer DPL may include the bank pattern BNP, the pixel electrodes ELT, a first insulating layer INS1, the light-emitting elements LD, a second insulating layer INS2, the contact electrodes CNE, and a third insulating layer INS3 sequentially disposed and/or formed on the pixel circuit layer PCL.

The bank pattern BNP may be disposed on the surface of the base layer BSL having the pixel circuit layer PCL selectively formed thereon. The bank pattern BNP may protrude in a height direction of the base layer BSL on the surface of the base layer BSL having the pixel circuit layer PCL. Therefore, a region of the pixel electrodes ELT disposed on the bank pattern BNP may protrude upward.

The bank pattern BNP may include at least one inorganic and/or organic insulating material. For example, the bank pattern BNP may include at least one layer of an inorganic layer including various inorganic insulating materials, such as silicon nitride ($SiN_x$), silicon oxide ($SiO_x$), silicon oxide nitride ($SiOxN_y$), or a combination thereof. As another example, the bank pattern BNP may include at least one organic layer including various types of organic insulating materials, or may be formed as a single-layered or multi-layered insulators including organic/inorganic materials in combination. For example, the material and cross-sectional structure of the bank pattern BNP may be variously changed.

A reflective wall may be formed around the light-emitting elements LD by the bank pattern BNP and the pixel electrodes ELT disposed thereon. For example, in case that the pixel electrodes ELT include a reflective electrode layer, light emitted from ends of the light-emitting elements LD may be reflected from the pixel electrodes ELT and may be emitted in an upward direction of each pixel PXL.

The bank pattern BNP may have various shapes. In an embodiment, the bank pattern BNP may have an inclined surface inclined at an angle of a range with respect to the base layer BSL as illustrated in FIGS. 11 and 12. For example, the bank pattern BNP may have a trapezoidal cross section. In another embodiment, the bank pattern BNP may have sidewalls such as a curved surface or a staircase. For example, the bank pattern BNP may have a cross section such as a semicircle or semi-ellipse.

The pixel electrodes ELT of each pixel PXL may be disposed on the bank pattern BNP. According to an embodiment, the pixel electrodes ELT may have a shape corresponding to the bank patterns BNP. For example, the pixel electrodes ELT may protrude in the height direction of the base layer BSL by the bank patterns BNP.

The pixel electrodes ELT may include at least one conductive material. For example, the pixel electrodes ELT may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, or alloys thereof, conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), fluorine-doped tin oxide (FTO), or the like, and a conductive polymer such as PEDOT, but is not limited thereto. For example, the pixel electrodes ELT may include other conductive materials such as carbon nanotubes or graphene. For example, the pixel electrodes ELT may have conductivity by including at least one among various conductive materials, and the material of the pixel electrodes ELT is not limited to a particular material. The pixel electrodes ELT may include the same or different conductive materials.

The pixel electrodes ELT may be formed of a single or multiple layers. For example, the pixel electrodes ELT may include a reflective electrode layer including a reflective conductive material (e.g., metal). The pixel electrodes ELT may further include at least one among a transparent electrode layer disposed on and/or under the reflective electrode layer, and a conductive capping layer covering an upper portion of the reflective electrode layer and/or the transparent electrode layer.

The first insulating layer INS1 may be disposed on a region of the pixel electrodes ELT. For example, the first insulating layer INS1 may cover a region of each of the pixel electrodes ELT and may include an opening (or contact hole) exposing another region of each of the pixel electrodes ELT.

The pixel electrodes ELT may be electrically connected to the contact electrodes CNE in the region in which the first insulating layer INS1 may be opened, respectively. In embodiments, the first insulating layer INS1 may be omitted. The light-emitting elements LD may be directly disposed on an end of the passivation layer PSV and/or the pixel electrodes ELT.

In an embodiment, the first insulating layer INS1 may entirely cover the pixel electrodes ELT. After the light-emitting elements LD may be supplied and aligned on the first insulating layer INS1, the first insulating layer INS1 may be partially opened to expose a region of the pixel electrodes ELT. Since the pixel electrodes ELT may be formed and covered by the first insulating layer INS1 or the like, the pixel electrodes ELT may be prevented from being damaged in a subsequent process.

The light-emitting elements LD may be supplied and aligned in the light-emitting area EA having the first insulating layer INS1 or the like. In an embodiment, before the pixel electrodes ELT may be divided into individual electrodes, the light-emitting elements LD may be supplied to each pixel area PXA through an ink jet method or a slit coating method. Each of the light-emitting elements LD may be aligned in each of the light-emitting areas EA by applying alignment signals to the alignment lines before being divided into the pixel electrodes ELT.

In an embodiment, each light-emitting element LD may directly contact the adjacent pair of pixel electrodes ELT to be connected between the pair of pixel electrodes ELT. In another embodiment, each light-emitting element LD may or may not directly contact the adjacent pair of pixel electrodes ELT and may be connected to the pair of pixel electrodes ELT by contact electrodes CNE.

The second insulating layer INS2 may be disposed on a region of the light-emitting elements LD. For example, the second insulating layer INS2 may be disposed on the region of the light-emitting elements LD to expose the first and second ends EP1 and EP2 of each of the light-emitting elements LD. For example, the second insulating layer INS2 may be partially disposed on a region including a central region of each of the light-emitting elements LD. The second insulating layer INS2 may be formed as an independent pattern in the light-emitting area EA of each pixel PXL, but is not limited thereto. The second insulating layer INS2 may be formed on the light emitting elements LD after the alignment of the light emitting elements LD may be completed, and thus the light emitting elements LD may be prevented from deviating from the aligned positions.

The ends of the light-emitting elements LD not covered by the second insulating layer INS2, for example, the first and second ends EP1 and EP2, may be covered by the contact electrodes CNE, respectively. The contact electrodes CNE may be disposed on the pixel electrodes ELT to cover the exposed areas of each of the pixel electrodes ELT. For example, the contact electrodes CNE may be disposed on the pixel electrodes ELT so as to directly or indirectly contact each of the pixel electrodes ELT on and/or around the bank patterns BNP.

In an embodiment, a pair of contact electrodes CNE (e.g., first and second contact electrodes CNE1 and CNE2) disposed in each light-emitting element array area AR may be disposed in the same layer. The pair of contact electrodes CNE may be simultaneously formed in the same process or may be sequentially selected in different processes.

Therefore, the contact electrodes CNE may be electrically connected to each of the pixel electrodes ELT. Through the contact electrodes CNE, the pixel electrodes ELT may be electrically connected to adjacent light-emitting elements LD.

For example, the first contact electrode CNE1 may be connected to the first electrode ELT1, and the second contact electrode CNE2 may be connected to the second electrode ELT2. The first electrode ELT1 may be connected to the first ends EP1 of the light-emitting elements LD through the first contact electrode CNE1, and the second electrode ELT2 may be connected to the second ends EP2 of the light-emitting elements LD through the second contact electrode CNE2.

The contact electrodes CNE may include a transparent conductive material. For example, the contact electrodes CNE may include at least one among various transparent conductive materials including conductive oxides such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), fluorine-doped tin oxide (FTO), or the like. Therefore, light emitted from the light-emitting elements LD through each of the first and second ends EP1 and EP2 may pass through the contact electrodes CNE and may be emitted outside the pixel PXL.

The third insulating layer INS3 may be disposed on the contact electrodes CNE. For example, the third insulating layer INS3 may be entirely formed and/or disposed in the display area DA to cover each pixel area PXA having the bank pattern BNP, the pixel electrodes ELT, the light-emitting elements LD, the contact electrodes CNE, or the like.

Each of the first to third insulating layers INS1 to INS3 may be composed of a single or multiple layers and may include at least one inorganic and/or organic insulating material. In an embodiment, each of the first to third insulating layers INS1 to INS3 may include an inorganic insulating layer including at least one type of inorganic insulating material including silicon nitride ($SiN_x$), silicon oxide ($SiO_x$), or silicon oxide nitride ($SiO_xN_y$), but is not limited thereto.

For example, the second insulating layer INS2 may include an organic insulating layer including at least one type of organic insulating material including a photoresist PR material. The third insulating layer INS3 may also include at least one organic insulating layer. A surface of the third insulating layer INS3 may be substantially flat. The third insulating layer INS3 may be formed as at least one inorganic insulating layer. The third insulating layer INS3 may have a surface profile corresponding to the shape of electrodes and/or insulating layers thereunder.

The light control layer LCTL may be provided on the display element layer DPL. A filler layer or a protective layer may be additionally provided between the display element layer DPL and the light control layer LCTL. For example, a filler layer having a low refractive index, an inorganic protective layer, and/or an overcoat layer may be additionally provided between the display element layer DPL and the light control layer LCTL.

The light control layer LCTL may include each light conversion layer LCL disposed on each pixel area PXA, in particular, each light-emitting area EA, and the light blocking layer LBP and the first reflective layer RFL1 provided between the light conversion layers LCL to surround each light conversion layer LCL. The light control layer LCTL may further include a protective layer PRL provided in the display area DA to cover the light conversion layers LCL, the light blocking layer LBP, and the first reflective layer RFL1.

The light conversion layers LCL may include a first light conversion layer LCL1 provided in the light-emitting area EA of the first pixel PXL1, a second light conversion layer LCL2 provided in the light-emitting area EA of the second pixel PXL2, and a third light conversion layer LCL3 provided in the light-emitting area EA of the third pixel PXL3. The first, second, and third light conversion layers LCL1, LCL2, and LCL3 may be formed as a separate pattern corresponding to each pixel PXL and may be surrounded by the light blocking layer LBP and the first reflective layer RFL1.

In an embodiment, a passivation layer PTL may be provided on surfaces of the first, second, and third light conversion layers LCL1, LCL2, and LCL3. The passivation layer PTL may be provided as a capping layer for protecting the first, second, and third light conversion layers LCL1, LCL2, and LCL3. The passivation layer PTL may be formed as at least one layer of an inorganic insulating layer, but is not limited thereto.

In an embodiment, the first, second, and third pixels PXL1, PXL2, and PXL3 may include the light-emitting elements LD emitting light of the same color, and at least one among the first, second, and third light conversion layers LCL1, LCL2, and LCL3 may include color conversion particles. For example, each of the first, second, and third pixels PXL1, PXL2, and PXL3 may include at least one blue light-emitting element LDb emitting blue light in a wavelength band of about 400 nm to about 500 nm. Each of the first and second light conversion layers LCL1 and LCL2 may include color conversion particles corresponding to a color. Therefore, even if all of the pixels PXL include the light-emitting elements LD of the same color, the display panel DP may display a full-color image. The third light conversion layer LCL3 may or may not include color conversion particles. For example, the third light conversion layer LCL3 may not include color conversion particles and may include light scattering particles SCT.

The first light conversion layer LCL1 (also referred to as a "first color conversion layer") may be disposed in the light-emitting area EA of the first pixel PXL1. The first light conversion layer LCL1 may convert light, emitted from the light-emitting elements LD of the first pixel PXL1, into light of a different color. To this end, the first light conversion layer LCL1 may be disposed on the light-emitting elements LD of the first pixel PXL1 and may include first color conversion particles. For example, in case that the light-emitting elements LD provided in each of the first pixels PXL1 are blue light-emitting elements LDb emitting blue light and the first pixel PXL1 is a red pixel, the first light conversion layer LCL1 may include a red quantum dot QDr for converting blue light, emitted from the blue light-emitting elements LDb, into red light.

For example, the first light conversion layer LCL1 may include red quantum dots QDr dispersed in a matrix material such as a transparent resin, or the like. The red quantum dots QDr may absorb blue light and shift a wavelength according to an energy transition to emit red light in a wavelength band of about 620 nm to about 780 nm. In case that the first pixel PXL1 is a pixel of a different color, the first light conversion layer LCL1 may include color conversion particles of a different color corresponding to the color of the third pixel PXL3.

In an embodiment, the first light conversion layer LCL1 may include a type of color conversion particles, but is not limited thereto. For example, the first light conversion layer LCL1 may compositely include at least two types of color conversion particles having different emission spectrum (e.g., peak wavelength). The first light conversion layer LCL1 may further include light scattering particles (e.g., light scattering particles of a type the same as or different from those of the light scattering particles SCT included in the third light conversion layer LCL3).

The second light conversion layer LCL2 (also referred to as a "second color conversion layer") may be disposed in the light-emitting area EA of the second pixel PXL2. The second light conversion layer LCL2 may convert light, emitted from the light-emitting elements LD of the second pixel PXL2, into light of a different color. To this end, the second light conversion layer LCL2 may be disposed on the light-emitting elements LD of the second pixel PXL2 and may include second color conversion particles. For example, in case that the light-emitting elements LD provided in each second pixel PXL2 are blue light-emitting elements LDb emitting blue light and the second pixel PXL2 is a green pixel, the second light conversion layer LCL2 may include a green quantum dot QDg for converting blue light, emitted from the blue light-emitting elements LDb, into green light.

For example, the second light conversion layer LCL2 may include green quantum dots QDg dispersed in a matrix material such as a transparent resin, or the like. The green quantum dot QDg may absorb blue light and shift a wavelength according to an energy transition to emit green light in a wavelength band of about 500 nm to about 570 nm. In case that the second pixel PXL2 is a pixel of a different color, the second light conversion layer LCL2 may include color conversion particles of a different color corresponding to the color of the second pixel PXL2.

In an embodiment, the second light conversion layer LCL2 may include a type of color conversion particles, but is not limited thereto. For example, the second light conversion layer LCL2 may compositely include at least two types of color conversion particles having different emission spectrum (e.g., peak wavelength). The second light conversion layer LCL2 may further include light scattering particles (e.g., light scattering particles of a type the same as or different from those of the light scattering particles SCT included in the third light conversion layer LCL3).

The third light conversion layer LCL3 (also referred to as a "light scattering layer") may be disposed in the light-emitting area EA of the third pixel PXL3. In an embodiment, in case that the light-emitting elements LD provided in the third pixel PXL3 are blue light-emitting elements LDb emitting blue light and the third pixel PXL3 is a blue pixel, the third light conversion layer LCL3 may be selectively provided to efficiently utilize light emitted from the blue light-emitting elements LDb. The third light conversion layer LCL3 may include at least one type of light scattering particles SCT.

For example, the third light conversion layer LCL3 may include light scattering particles SCT dispersed in a matrix material. For example, the third light conversion layer LCL3 may include light scattering particles SCT such as titanium oxide ($Ti_xO_y$) including titanium dioxide ($TiO_2$) or silica, but is not limited thereto.

The light scattering particles SCT may not be required to be provided to the third light conversion layer LCL3. For example, the first light conversion layer LCL1 and/or the second light conversion layer LCL2 may also further include light scattering particles SCT.

The light blocking layer LBP may be disposed in the non-light-emitting areas NEA of the pixels PXL so as to surround each light conversion layer LCL when viewed at least in a plan view. For example, the light blocking layer LBP may have openings OPN corresponding to each of the first, second, and third light conversion layers LCL1, LCL2, and LCL3 and may be provided between the first, second, and the third light conversion layers LCL1, LCL2, and LCL3.

According to an embodiment, the light blocking layer LBP may have a lower height than the first, second, and third light conversion layers LCL1, LCL2, and LCL3 so as to surround a portion of side surfaces of the first, second, and third light conversion layers LCL1, LCL2, and LCL3. For example, the light blocking layer LBP may have a lower height than the first, second and third light conversion layers LCL1, LCL2, and LCL3 with respect to a surface of the base layer BSL so as to expose an upper end portion of side surfaces of the first, second, and third light conversion layers LCL1, LCL2, and LCL3.

The light blocking layer LBP may include at least one black matrix material. For example, the light blocking layer LBP may include at least one black matrix material (e.g., at least one light-blocking material) among various types of black matrix materials, and/or a color filter material of a specific color. For example, the light blocking layer LBP may be formed as a black opaque pattern capable of blocking transmission of light.

The first reflective layer RFL1 may be provided on the light blocking layer LBP. For example, the first reflection layer RFL1 may be provided on the light blocking layer LBP between the first, second, and third light conversion layers LCL1, LCL2, and LCL3 and may have openings OPN corresponding to the first, second, and third light conversion layers LCL1, LCL2, and LCL3. For example, the first reflective layer RFL1 may be disposed in the non-light-emitting areas NEA of the pixels PXL so as to surround each light conversion layer LCL when viewed at least in a plan view.

In an embodiment, the first reflective layer RFL1 may have a height less than or equal to the height of the first, second, and third light conversion layers LCL1, LCL2, and LCL3 with respect to a surface of the base layer BSL. For example, each of the first, second, and third light conversion layers LCL1, LCL2, and LCL3 may have a dome shape and may protrude at a higher height than the first reflective layer RFL1 with respect to the surface (e.g., upper surface) of the base layer BSL.

The first reflective layer RFL1 may include at least one type of reflective material. For example, the first reflective layer RFL1 may include at least one metal layer.

In an embodiment, the first reflective layer RFL1 may include metals having a high reflectance in the visible light wavelength band, for example, at least one of various metal materials including aluminum (Al), gold (Au), and silver (Ag). The first reflective layer RFL1 may have a thickness sufficient to secure a reflectance. For example, the first reflective layer RFL1 may have a thickness of about 40 nm or more, thereby securing a sufficient reflectance.

As described above, in case that the first reflective layer RFL1 is formed on the light blocking layer LBP, light directed from each light conversion layer LCL to the non-light-emitting area NEA around the light conversion layer LCL, in particular, light traveling in the direction of the first reflective layer RFL1 may be reflected to each light conversion layer LCL so that light recycling may be induced. Therefore, light efficiency of the pixels PXL and the display panel DP including the same may be increased, and color reproducibility and luminance thereof may be increased.

By reflecting external light by the first reflective layer RFL1, a mirror type of the display device DD may be implemented. For example, external light may be reflected by the first reflective layer RFL1 while the pixels PXL do not emit light or emit light with low luminance in case that the display panel DP is turned off or driven in a specific mode (e.g., mirror mode), thereby forming a mirror surface as the image display surface (e.g., front surface) of the display panel DP. Therefore, it may be possible to satisfy diversified consumers' needs and to expand an application field of the display device in various ways and/or for various purposes, including advertisements, vehicles, houses, furniture, or the like.

The size and/or position (e.g., the relative size and/or position) of the first, second, and third light conversion layers LCL1, LCL2, and LCL3, the light blocking layer LBP, and/or the first reflective layer RFL1 may be determined in consideration of an aperture ratio of the pixels PXL. For example, in consideration of the aperture ratio of each pixel PXL, the area and/or mutual height of the first, second, and third light conversion layers LCL1, LCL2, and LCL3, the light blocking layer LBP, and/or the first reflective layer RFL1 may be determined.

The shapes of the first, second, and third light conversion layers LCL1, LCL2, and LCL3 and the resulting shape of the light shielding layer LBP and/or the first reflective layer RFL1 may be variously changed according to embodiments. For example, in consideration of the material, process method, and/or light emission characteristics of the first, second and third light conversion layers LCL1, LCL2, and LCL3, the shapes of the first, second, and third light conversion layers LCL1, LCL2, and LCL3 may be determined.

The sum of the thicknesses of the light blocking layer LBP and the first reflective layer RFL1 may be smaller than the thickness of each of the first, second, and third light conversion layers LCL1, LCL2, and LCL3. Therefore, the first, second, and third light conversion layers LCL1, LCL2, and LCL3 may protrude higher than the light blocking layer LBP and the first reflective layer RFL1.

An upper opening OPN_U of the light blocking layer LBP and the first reflective layer RFL1 may have a smaller area than a lower opening OPN_L thereof. The area of the upper layer of each light conversion layer LCL may be smaller than the area of the lower layer thereof. The upper opening of the light blocking layer LBP may have a larger area than the upper opening thereof (e.g., the upper opening OPN_U of the light blocking layer LBP and the first reflective layer RFL1) of the first reflective layer RFL1. Therefore, light traveling from each light conversion layer LCL to the first reflection layer RFL1 may be reflected to be re-incident to the light conversion layer LCL, so that the light may be reconverted.

The embodiments of FIGS. 11 and 12 illustrate a display panel DP having a structure in which the light conversion layers LCL may be first formed on a surface of the base layer BSL in which the pixels PXL may be provided, and the light blocking layer LBP and the first reflective layer RFL1 may be sequentially formed between the light conversion layers LCL, but an order for forming the light conversion layers LCL, the light blocking layer LBP, and/or the first reflective layer RFL1 may vary. For example, in another embodiment, the light blocking layer LBP and the first reflective layer RFL1 including openings OPN corresponding to the light-emitting area EA of each pixel PXL on a surface of the base layer BSL in which the pixels PXL may be provided, may be sequentially formed, and each light conversion layer LCL may be formed in each opening OPN. For example, according to a manufacturing facility, a process method, and/or a design structure of the display panel DP, the order for forming the light conversion layers LCL, the light blocking layer LBP, and/or the first reflective layer RFL1 may vary.

The protective layer PRL may be disposed on the surface of the light control layer LCTL. For example, the protective layer PRL may be entirely formed in the display area DA to cover the light conversion layers LCL, the light blocking layer LBP, and the first reflective layer RFL1. In the description of embodiments, the protective layer PRL has been described as a component of the light control layer LCTL, but embodiments are not limited thereto. For example, the protective layer PRL may be regarded as a separate component from the light control layer LCTL.

The protective layer PRL may include at least one layer of an inorganic and/or organic layer. The protective layer PRL may be provided as a capping layer for protecting the first, second, and third light conversion layers LCL1, LCL2, and LCL3 and/or the first reflective layer RFL1.

The protective layer PRL may be formed as a single or multiple layers including at least one of various types of inorganic and organic insulating materials. In case that the protective layer PRL includes an organic layer, an upper portion of a surface of the base layer BSL on which the light conversion layers LCL, the light blocking layer LBP, the first reflective layer RFL1, or the like may be provided, may be planarized. For example, the protective layer PRL may planarize the surface of the light control layer LCTL including the light conversion layers LCL, the light blocking layer LBP, and the first reflective layer RFL1.

In an embodiment, the protective layer PRL may include an encapsulation layer ENC (see FIG. 3). For example, the protective layer PRL may include a single-layered or multi-layered thin film encapsulation layer. Therefore, the pixels PXL and the light control layer LCTL may be protected.

FIGS. 13 to 26 are schematic cross-sectional views each illustrating a display area DA according to an embodiment. For example, FIGS. 13 to 26 illustrate other embodiments of a cross section taken along line II-II' of FIG. 10. In the description of the embodiments of FIGS. 13 to 26, the same reference numerals are assigned to configurations similar to or the same as those of the at least one embodiment described above, and detailed descriptions thereof will be omitted.

Figure 13:
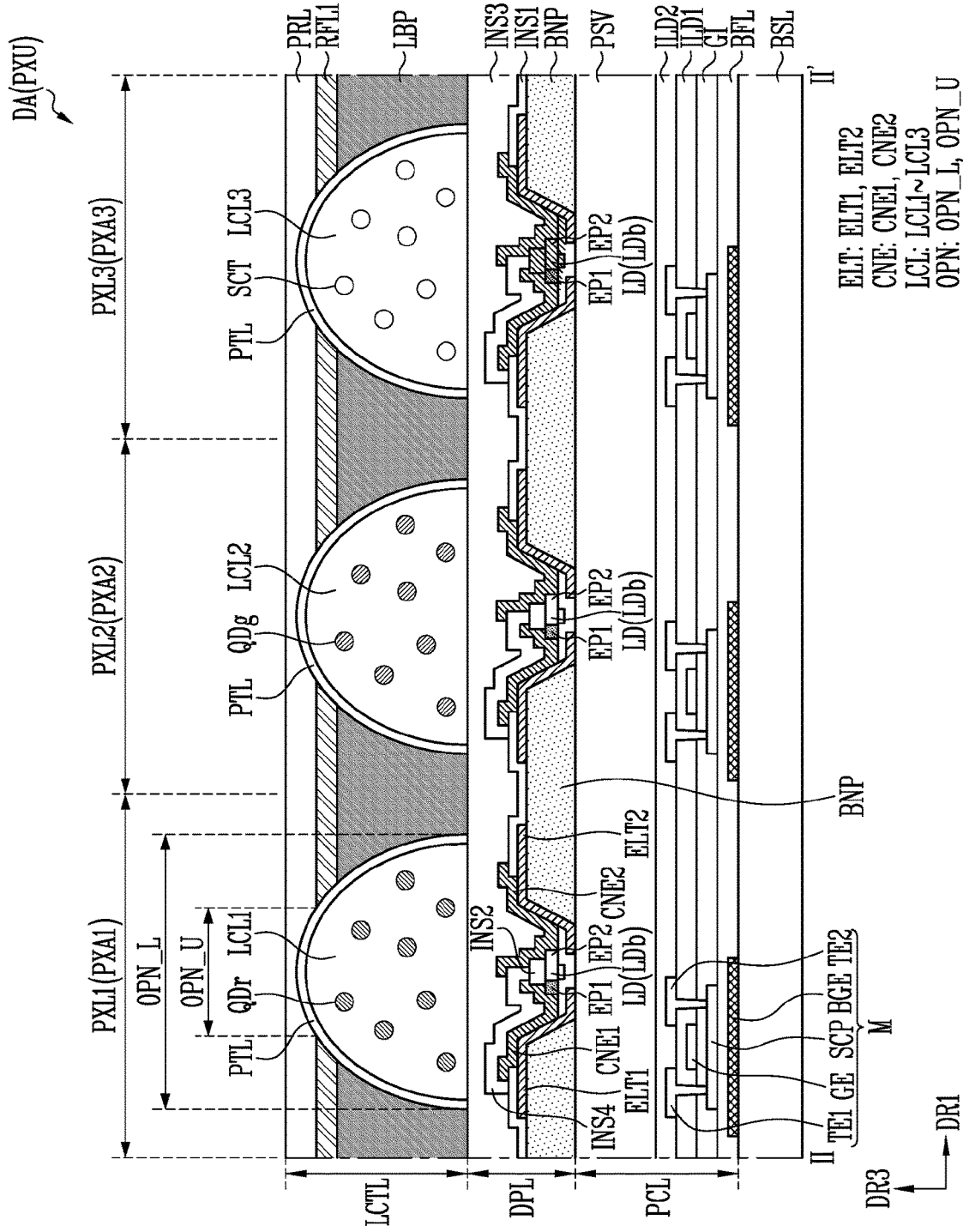
FIGS. 13 to 26 are schematic cross-sectional views each illustrating a display area according to an embodiment of the disclosure.

Referring to FIG. 13, a pair of contact electrodes CNE disposed in each light-emitting element array area AR may be separated and disposed in different layers. The display element layer DPL may further include a fourth insulating layer INS4 interposed between the pair of contact electrodes CNE. For example, the fourth insulating layer INS4 may be interposed between the first and second contact electrodes CNE1 and CNE2.

The fourth insulating layer INS4 may cover one of the pair of contact electrodes CNE. For example, the fourth insulating layer INS4 may cover the first contact electrode CNE1, and an end of the fourth insulating layer INS4 may be interposed between the first and second contact electrodes CNE1 and CNE2.

In case that the fourth insulating layer INS4 is formed, electrical stability between the first and second ends EP1 and EP2 of the light-emitting elements LD may be secured. Therefore, it may be possible to prevent a short defect between the first and second ends EP1 and EP2 of the light-emitting elements LD.

Figure 14:
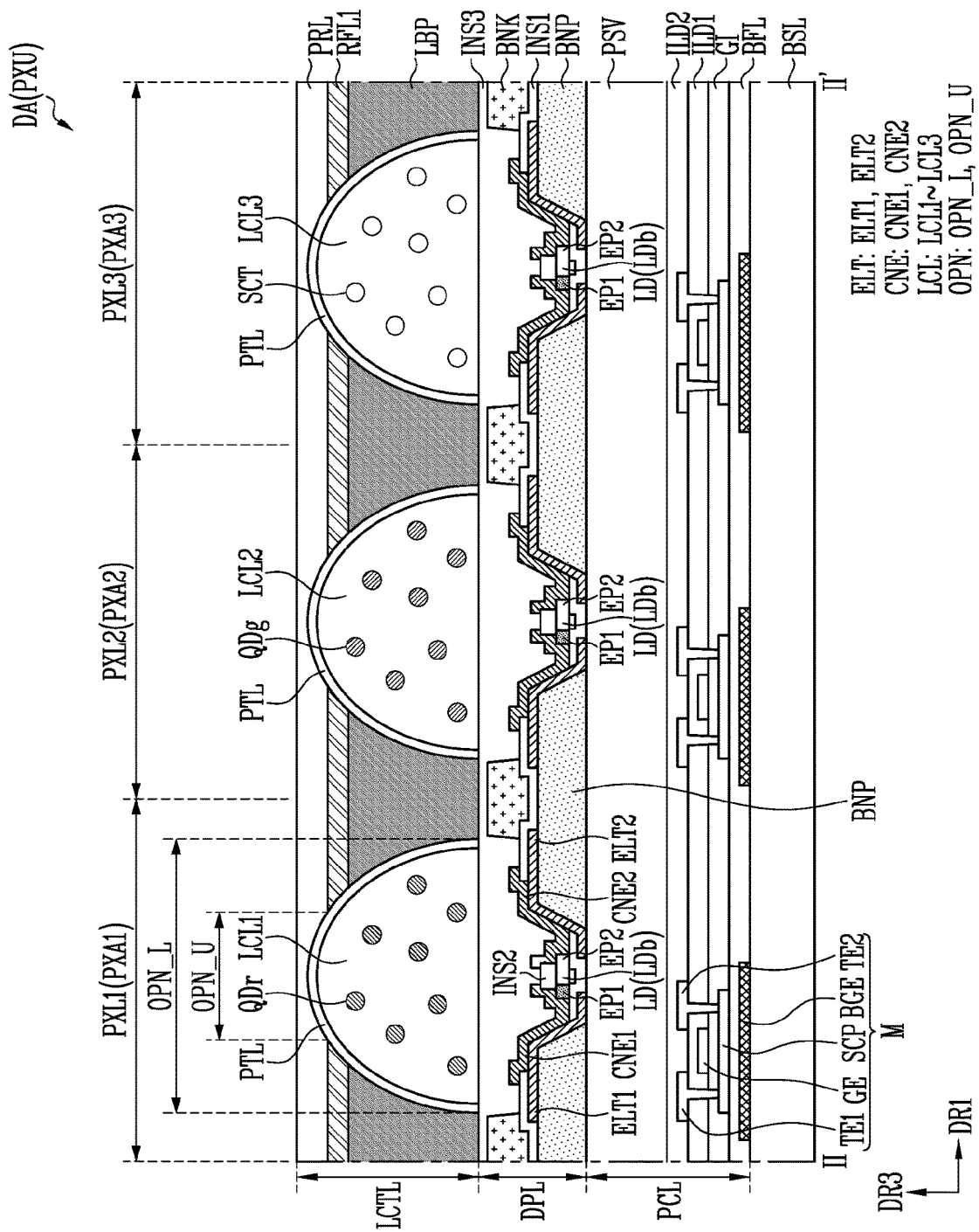

Referring to FIG. 14, the display element layer DPL may further include a BNK provided in the non-light-emitting areas NEA of the pixels PXL to surround the light-emitting areas EA of each of the pixels PXL. For example, the bank BNK may be disposed in boundary regions of the pixels PXL to overlap the light blocking layer LBP.

In an embodiment, the bank BNK may be disposed on the first insulating layer INS1, but the position of the bank BNK may vary according to the embodiment. The bank BNK may or may not overlap the bank pattern BNP.

The bank BNK may be covered by the third insulating layer INS3, but is not limited thereto. In an embodiment, the third insulating layer INS3 may include an organic layer and may planarize a surface of the base layer BSL having the bank BNK or the like. In another embodiment, the third insulating layer INS3 may include an inorganic layer and may have a surface profile due to electrodes, insulating layers, and/or banks BNK thereunder. In another embodiment, the third insulating layer INS3 may be formed inside the light-emitting areas EA by removing a portion thereof formed on the bank BNK.

In the supplying of the light-emitting elements LD to each pixel PXL, the bank BNK may form a dam structure defining each light-emitting area EA to which the light-emitting elements LD may be to be supplied. For example, by partitioning each light-emitting area EA by the bank BNK, a desired type and/or amount of light-emitting element ink may be supplied to the light-emitting area EA. In case that a region to which the light-emitting elements LD are to be supplied is sufficiently defined by the bank pattern BNP or the like and/or in case that the same type of light-emitting elements LD is supplied to the pixels PXL, the bank BNK may be omitted. As another example, the bank BNK may be integral with the bank pattern BNP.

The bank BNK may include at least one light-blocking and/or reflective material to more effectively prevent light leakage between adjacent pixels PXL. For example, the bank (BNK) may include at least one black matrix material (e.g., at least one light-blocking material) among various types of black matrix materials, and/or a color filter material of a specific color, or the like. For example, the bank BNK may be formed as a black opaque pattern capable of blocking transmission of light. In an embodiment, a reflective layer (not illustrated) may be formed on the surface (e.g., sidewall) of the bank BNK to increase light efficiency of each pixel PXL.

Figure 15:
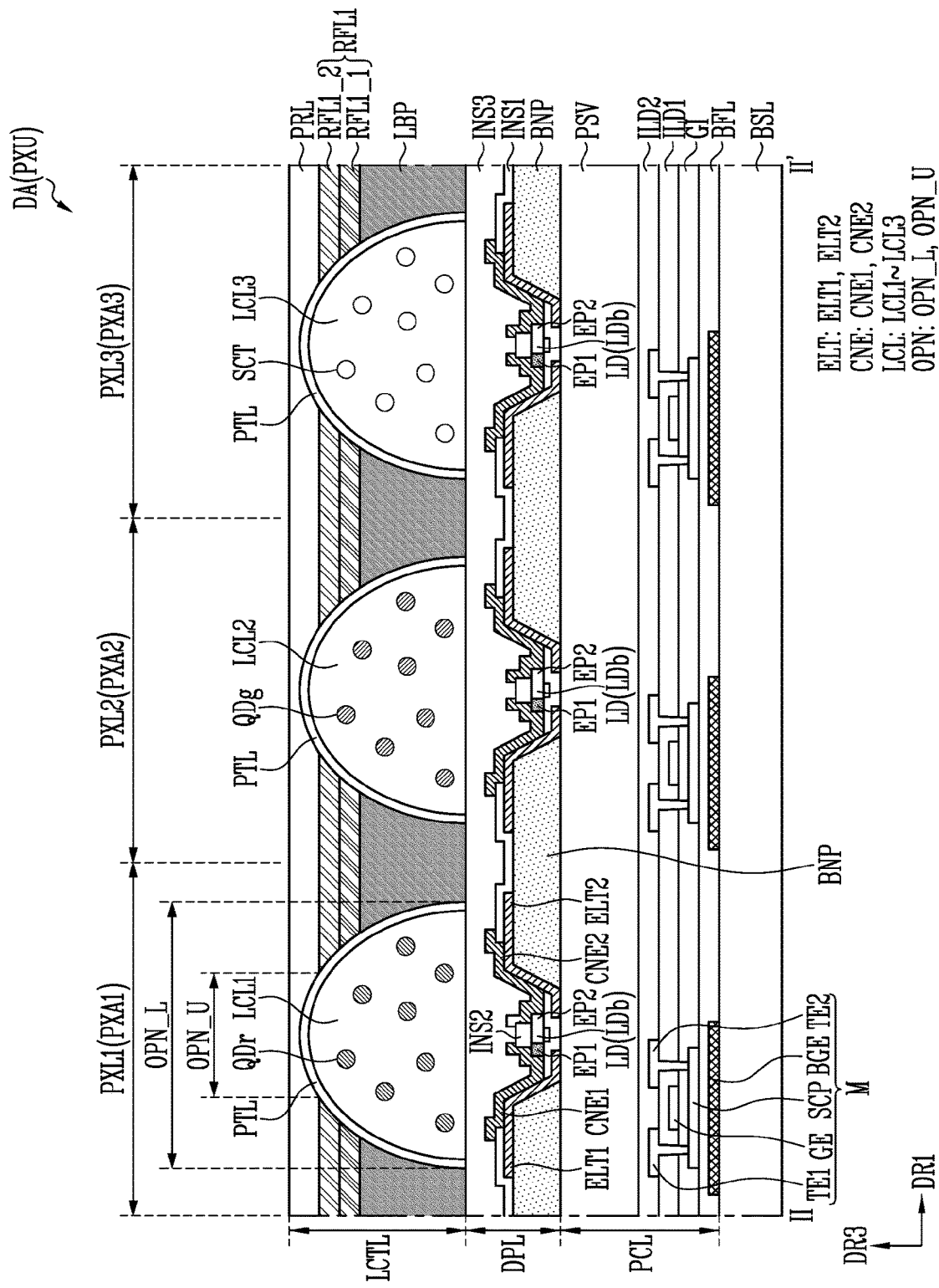

Referring to FIG. 15, the first reflective layer RFL1 may be formed as multiple layers. For example, the first reflective layer RFL1 may be composed of multiple layers including a first metal layer RFL1_1 including a first metal material, and a second metal layer RFL1_2 stacked on the first metal layer RFL1_1 and including a second metal material. In an embodiment, the first metal layer RFL1_1 may include aluminum (Al), and the second metal layer RFL1_2 may include silver (Ag), but embodiments are not limited thereto. For example, the materials of the first metal layer RFL1_1 and the second metal layer RFL1_2 and/or the stacking order thereof may be changed. For example, the materials of the first metal layer RFL1_1 and the second metal layer RFL1_2 and/or the stacking order thereof may be variously changed in consideration of reflectance or the like of the first reflective layer RFL1. The first reflective layer RFL1 may be formed as a triple layer or more.

Even in an embodiment in which the first reflective layer RFL1 is formed as multiple layers, the sum of the thicknesses of the light blocking layer LBP and the first reflective layer RFL1 may be smaller than the thickness of each of the first, second, and third light conversion layers LCL1, LCL2, and LCL3. Therefore, the first, second, and third light conversion layers LCL1, LCL2, and LCL3 may protrude higher than the light blocking layer LBP and the first reflective layer RFL1. Each of the first, second, and third light conversion layers LCL1, LCL2, and LCL3 may have a height higher than that of the light blocking layer LBP and the first reflective layer RFL1.

In an embodiment, the thickness (e.g., the sum of the thicknesses of the first and second metal layers RFL1_1 and RFL1_2) of the first reflective layer RFL1 may be smaller than that of the light blocking layer LBP, and the first reflective layer RFL1 may be disposed at a higher height than the light blocking layer LBP with respect to a surface of the base layer BSL. For example, the first and second metal layers RFL1_1 and RFL1_2 may be sequentially disposed on the light blocking layer LBP.

In an embodiment, the opening of the first metal layer RFL1_1 and the opening of the second metal layer RFL1_2 may have substantially the same or similar areas, but are not limited thereto. For example, the area of the opening of the first metal layer RFL1_1 may be larger than that of the opening of the second metal layer RFL1_2.

Figure 16:
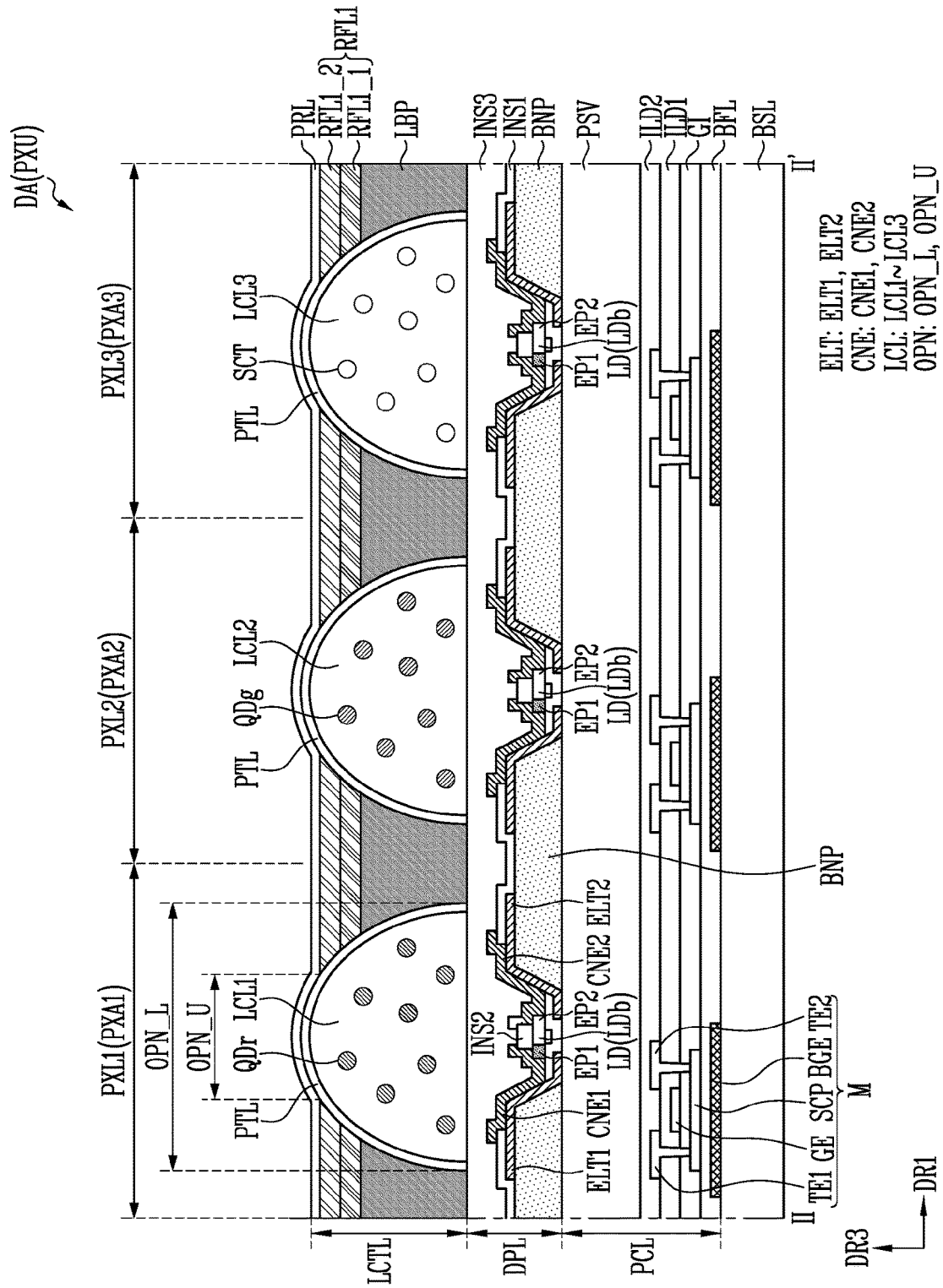

Referring to FIG. 16, the protective layer PRL may include at least one layer of an inorganic layer and may not include an organic layer. The protective layer PRL may have a surface profile depending on the height of components disposed thereunder, for example, the first, second, and third light conversion layers LCL1, LCL2, and LCL3 and the first reflective layer RFL1. In an embodiment, the protective layer PRL including the inorganic layer may have a thickness smaller than that of the protective layer PRL including the organic layer, but is not limited thereto.

In an embodiment, the protective layer PRL may be a low refractive index layer. For example, the protective layer PRL may have a refractive index lower than the first, second, and third light conversion layers LCL1, LCL2, and LCL3 and may have a refractive index of about 1.5. Therefore, it may be possible to increase the light emission efficiency.

Figure 17:
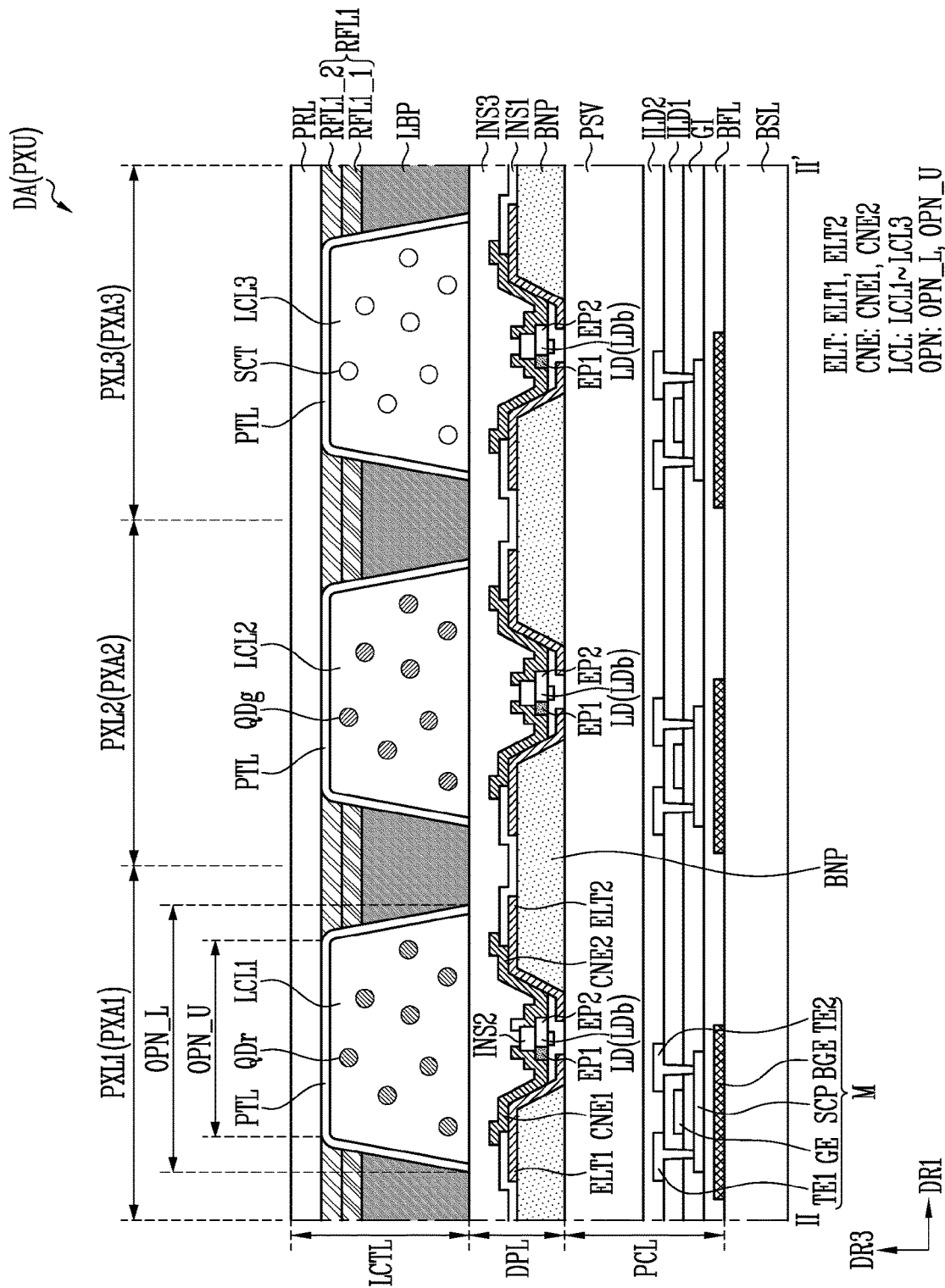

Referring to FIG. 17, the first, second, and third light conversion layers LCL1, LCL2, and LCL3 may have a shape other than a dome shape. For example, each of the first, second, and third light conversion layers LCL1, LCL2, and LCL3 may have a flat upper surface. For example, the upper surface of each of the first, second, and third light conversion layers LCL1, LCL2, and LCL3 may be flat by controlling a material and/or a process method of the first, second, and third light conversion layers LCL1, LCL2, and LCL3 or by using a subsequent process.

Each of the first, second, and third light conversion layers LCL1, LCL2, and LCL3 may have the uppermost portion having a larger surface area than when they have a dome shape. For example, a surface of the uppermost portion of each of the first, second, and third light conversion layers LCL1, LCL2, and LCL3 may have an area sufficient to secure an aperture ratio. The first, second, and third light conversion layers LCL1, LCL2, and LCL3 may have the same height as the first reflective layer RFL1 with respect to a surface of the base layer BSL.

Figure 18:
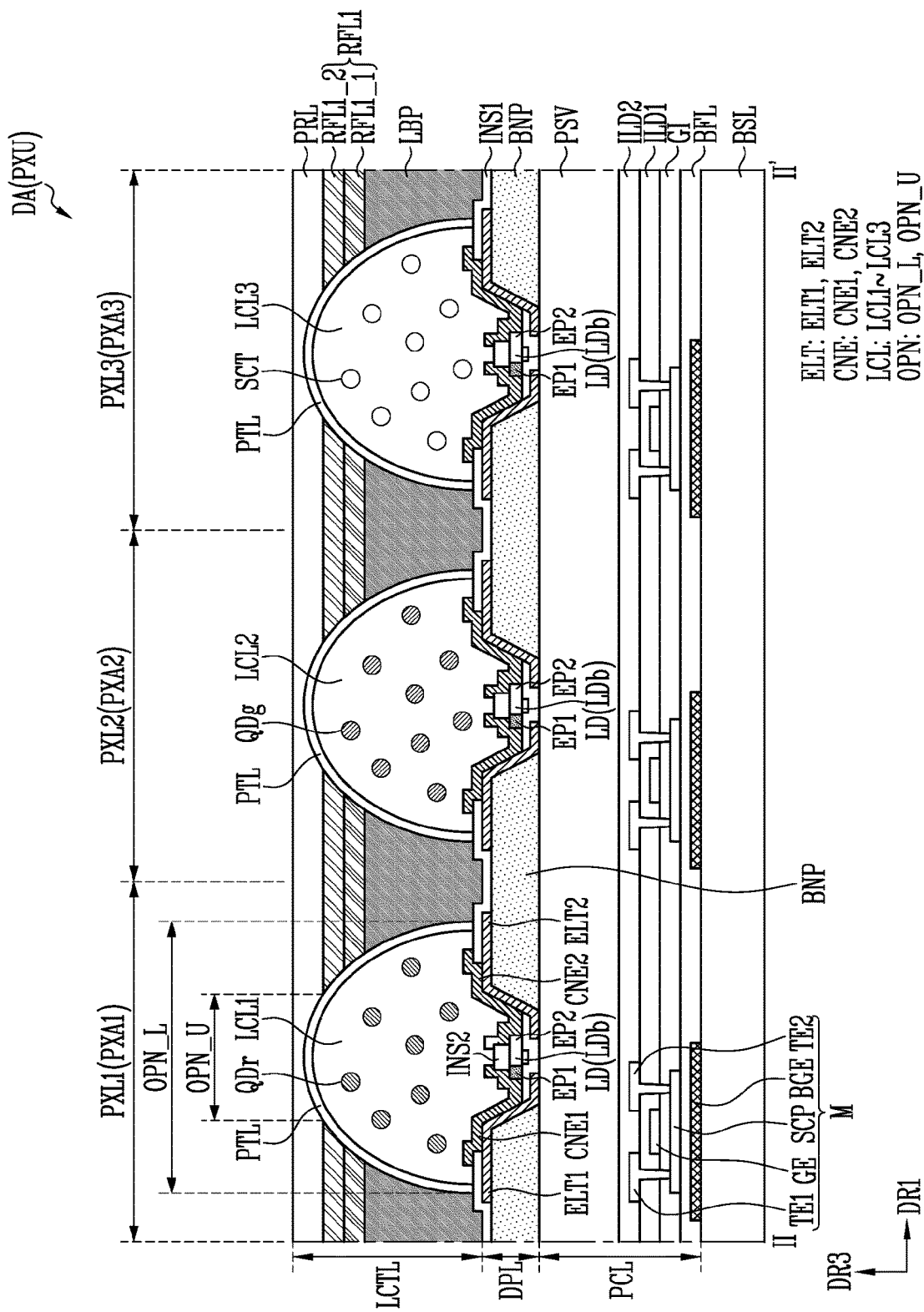

Referring to FIG. 18, the third insulating layer INS3 may be omitted. For example, the light control layer LCTL may be formed directly on a surface of the base layer BSL having the contact electrodes CNE or the like.

Figure 19:
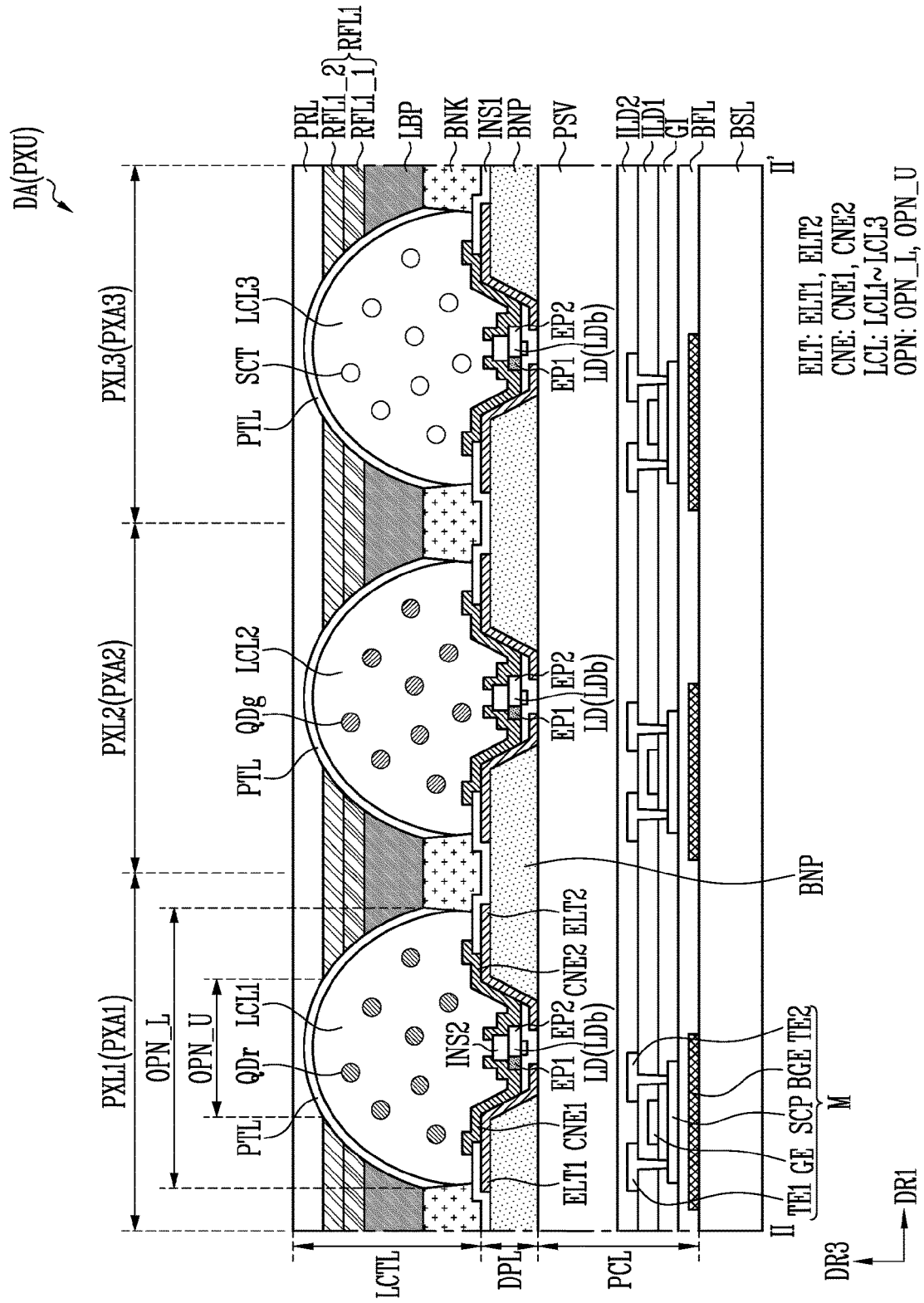

Referring to FIG. 19, a bank BNK may be formed in an embodiment not including the third insulating layer INS3 as needed. For example, the first, second, and third light conversion layers LCL1, LCL2, and LCL3 by a printing process (e.g., PR printing process) may be formed on a surface of the base layer BSL having the bank BNK, and the light blocking layer LBP may be formed directly on the bank BNK. As another example, the light blocking layer LBP and/or the first reflective layer RFL1 may be formed on the bank BNK, and the first, second and third light conversion layers LCL1, LCL2, and LCL3 may be formed. In an embodiment, the bank BNK may directly connect (for example, contact) the first, second, and third light conversion layers LCL1, LCL2, and LCL3.

Figure 20:
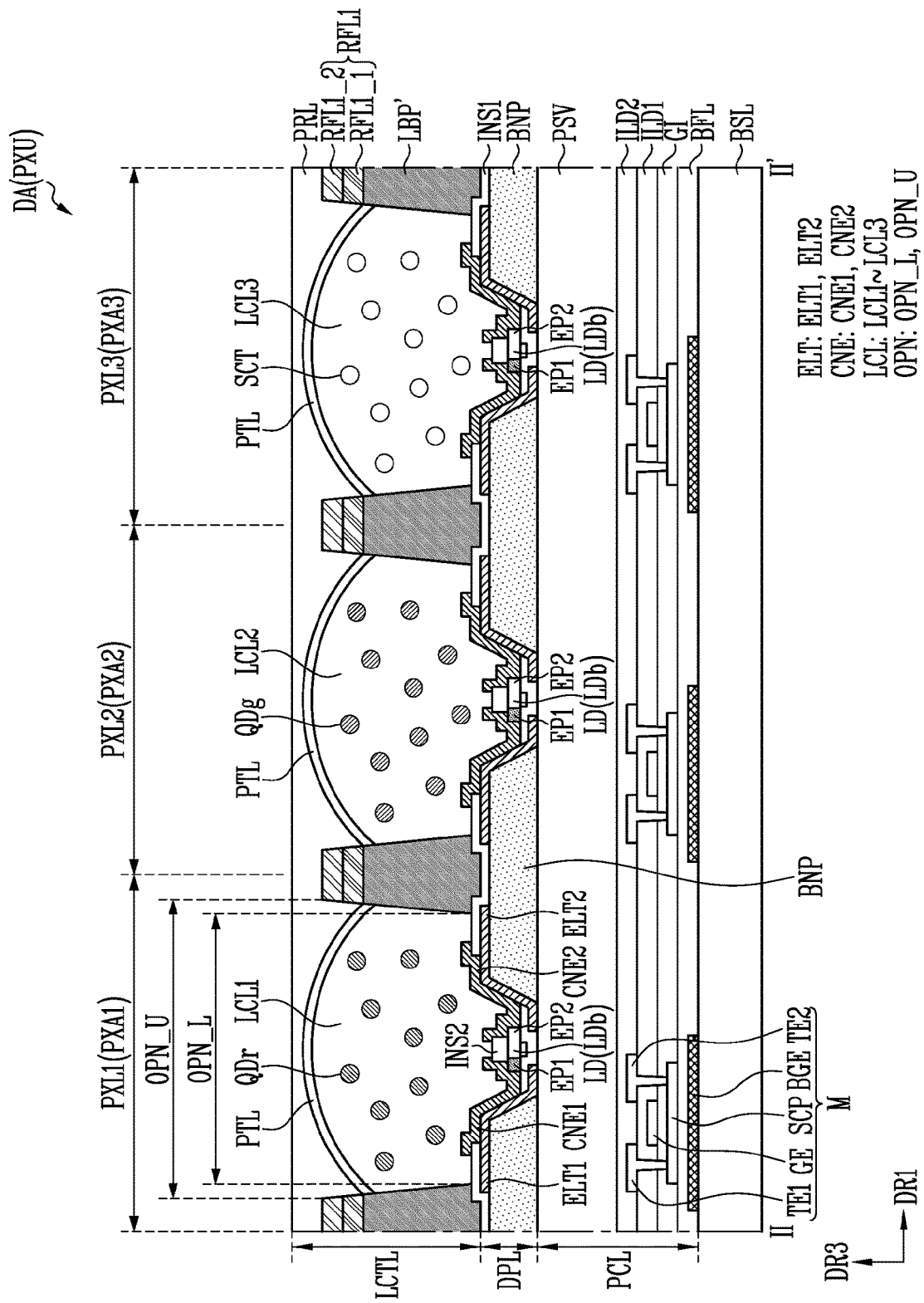

Referring to FIG. 20, a light blocking layer LBP' may be formed in which the bank BNK and the light blocking layer LBP according to the embodiment of FIG. 19 may be combined. For example, prior to forming the first, second, and third light conversion layers LCL1, LCL2, and LCL3 by an inkjet method, the light blocking layer LBP' and the reflective layer RFL1 may be sequentially formed on a surface of the base layer BSL (e.g., on the first insulating layer INS1) at a height sufficient to define an application area of the ink for forming the first, second, and third light conversion layers LCL1, LCL2, and LCL3. As another example, after the light blocking layer LBP' may be formed, the first, second, and third light conversion layers LCL1, LCL2, and LCL3 may be formed, and the first reflective layer RFL1 may be formed. The light blocking layer LBP' may be formed of a single or multiple layers.

Figure 21:
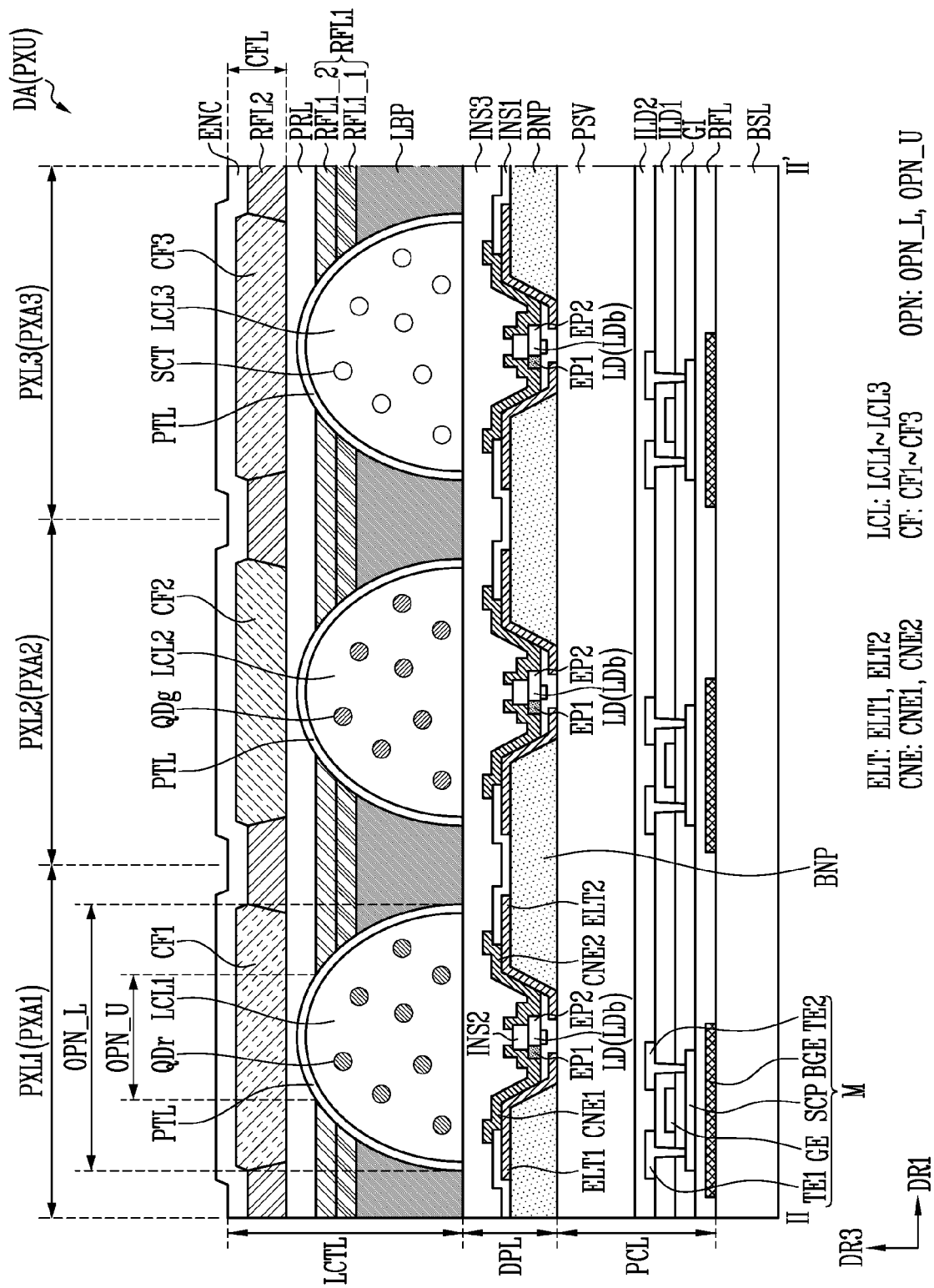

Referring to FIG. 21, the light control layer LCTL may further include a color filter layer CFL disposed on the first, second, and third light conversion layers LCL1, LCL2, and LCL3, the light blocking layer LBP, the first reflective layer RFL1, and the protective layer PRL. An encapsulation layer ENC may be provided on the color filter layer CFL. In an embodiment, components (for example, the first, second, and third light conversion layers LCL1, LCL2, and LCL3, the light blocking layer LBP, the first reflective layer RFL1, the protective layer PRL, and the color filter layer CFL) of the light control layer LCTL, may be directly formed on a surface of the base layer BSL on which the pixels PXL may be provided.

The color filter layer CFL may include first to third color filters CF1, CF2, and CF3 provided on the first, second, and third light conversion layers LCL1, LCL2, and LCL3. The color filter layer CFL may include a second reflective layer RFL2 provided between the first to third color filters CF1 to CF3 to surround the first to third color filters CF1 to CF3.

The first color filter CF1 may be disposed on the first light conversion layer LCL1 and may include a color filter material selectively transmitting light of a color corresponding to that of the first pixel PXL1. For example, in case that the first pixel PXL1 is a red pixel, and the first light conversion layer LCL1 includes a red quantum dot QDr converting light, emitted from the light-emitting elements LD of the first pixel PXL1, into red light, the first color filter CF1 may be a red color filter selectively transmitting red light emitted from the first light conversion layer LCL1.

The second color filter CF2 may be disposed on the second light conversion layer LCL2 and may include a color filter material selectively transmitting light of a color corresponding to that of the second pixel PXL2. For example, in case that the second pixel PXL2 is a green pixel, and the second light conversion layer LCL2 includes a green quantum dot QDg converting light, emitted from the light-emitting elements LD of the second pixel PXL2, into green light, the second color filter CF2 may be a green color filter selectively transmitting green light emitted from the second light conversion layer LCL2.

The third color filter CF3 may be disposed on the third light conversion layer LCL3 and may include a color filter material selectively transmitting light of a color corresponding to that of the third pixel PXL3. For example, in case that the third pixel PXL3 is a blue pixel, and blue light is emitted from the light-emitting elements LD and the third light conversion layer LCL3 of the third pixel PXL3, the third color filter CF3 may be a blue color filter selectively transmitting blue light emitted from the third light conversion layer LCL3.

The second reflective layer RFL2 may overlap the first reflective layer RFL1. For example, the second reflective layer RFL2 may include openings corresponding to the first, second, and third light conversion layers LCL1, LCL2, and LCL3 and may be disposed on the first reflective layer RFL1.

In an embodiment including the second reflective layer RFL2, the first reflective layer RFL1 may be selectively formed. For example, in an embodiment the light blocking layer LBP may be provided between the first, second, and third light conversion layers LCL1, LCL2, and LCL3, and the first reflective layer RFL1 may not be provided therebetween. The second reflective layer RFL2 may be disposed on the light blocking layer LBP to overlap the light blocking layer LBP. In another embodiment, the light blocking layer LBP and the first reflective layer RFL1 may be provided between the first, second and third light conversion layers LCL1, LCL2, and LCL3, and the second reflective layer RFL2 may be disposed on the first reflective layer RFL1 to overlap the first reflective layer RFL1.

The second reflective layer RFL2 may include at least one type of reflective material. For example, the second reflective layer RFL2 may include at least one metal layer. Therefore, even if the color filter layer CFL may be disposed on the light conversion layers LCL and the first reflective layer RFL1, a mirror type of the display device DD may be implemented, and the light efficiency of the pixels PXL and the display panel DP including the same may be increased.

In the embodiment of FIG. 21, the second reflective layer RFL2 including openings corresponding to the light-emitting areas EA of the pixels PXL may first be formed, and the first to third colors filters CF1 to CF3 may be formed in the openings. The first to third color filters CF1 to CF3 may protrude upward from the second reflective layer RFL2, but embodiments are not limited thereto.

The order for forming the first to third color filters CF1 to CF3 and the second reflective layer RFL2 and/or a manufacturing process therefor may be variously changed according to embodiments. For example, in another embodiment, the first to third color filters CF1 to CF3 may be first formed, and the second reflective layer RFL2 may be formed.

The encapsulation layer ENC may be disposed on the color filter layer CFL. For example, the encapsulation layer ENC may be formed on a surface of the base layer BSL to seal the display area DA in which the pixels PXL and the light control layer LCTL may be formed. In an embodiment, the encapsulation layer ENC may be a single-layered or multi-layered thin film encapsulation layer, but is not limited thereto.

Figure 22:
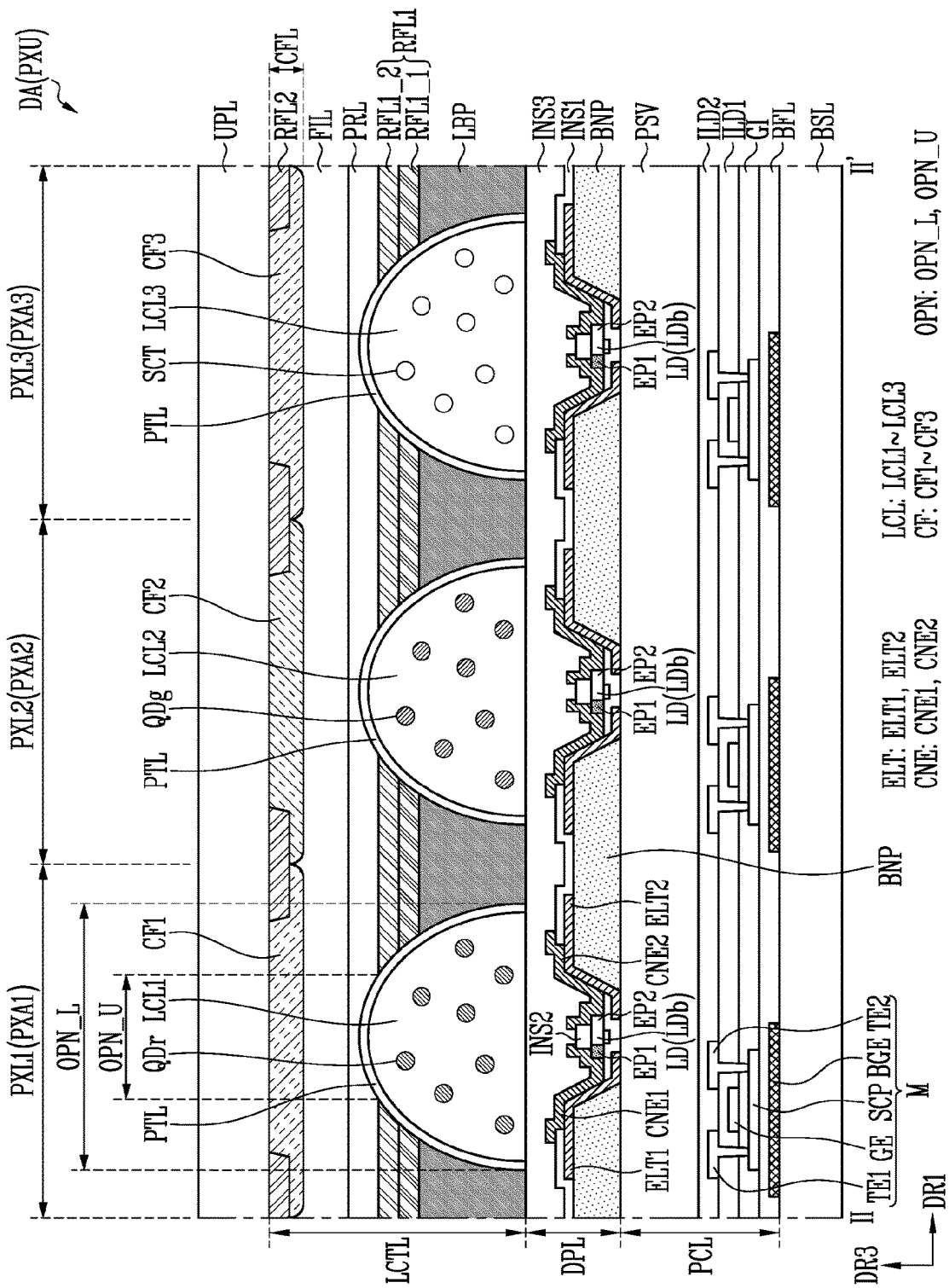

Referring to FIG. 22, the display panel DP may include an upper substrate UPL provided on a surface of the base layer BSL on which the pixels PXL or the like may be disposed to overlap at least the display area DA. For example, the upper substrate UPL may be disposed on the color filter layer CFL.

In an embodiment, the color filter layer CFL may be formed on a surface of the upper substrate UPL. For example, the pixels PXL, the first, second, and third light conversion layers LCL1, LCL2, and LCL3, the light blocking layer LBP, and the first reflective layer RFL1 may be formed on the surface of the base layer BSL having the pixels PXL, and the first to third color filters CF1 to CF3 and the second reflective layer RFL2 may be formed on the surface (e.g., a lower surface or an inner surface) of the upper substrate UPL facing the surface of the base layer BSL. Positions of components of the light control layer LCTL may be variously changed according to embodiments.

A filler layer FIL may be selectively provided between the base layer BSL and the upper substrate UPL. For example, a space between a lower panel of the display panel DP including the base layer BSL, the pixel circuit layer PCL, the display element layer DPL, the first, second, and third light conversion layers LCL1, LCL2, and LCL3, the light blocking layer LBP, and/or the first reflective layer RFL1, and an upper panel of the display panel DP including the upper substrate UPL and/or the color filter layer CFL may be filled with a filler having a relatively low refractive index so that light emitted from light-emitting elements LD may be smoothly emitted in the upward direction of the pixels PXL. In another embodiment, the space between the lower panel and the upper panel of the display panel DP may be filled with an air layer. In another embodiment, the protective layer PRL may function as a filler, and the upper panel of the display panel DP including the upper substrate UPL and/or the color filter layer CFL may be disposed on the protective layer PRL to contact the protective layer PRL.

The embodiment of FIG. 22 illustrates a structure in which the second reflective layer RFL2 may be first formed on a surface of the upper substrate UPL, and the first to third color filters CF1 to CF3 may be formed, but embodiments are not limited thereto. For example, in another embodiment, the first to third color filters CF1 to CF3 may be first formed, and the second reflective layer RFL2 may be formed.

Figure 23:
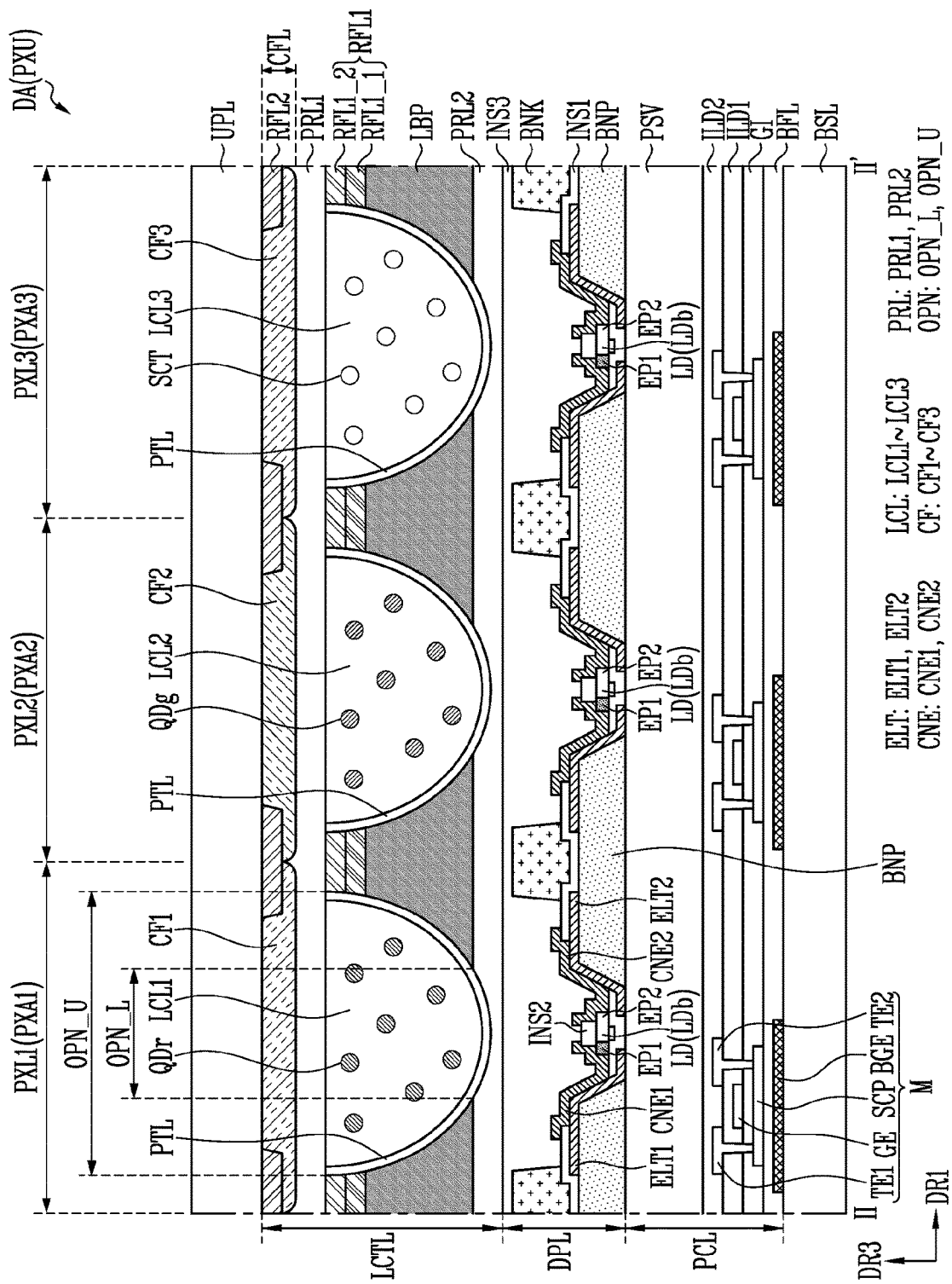
Figure 24:
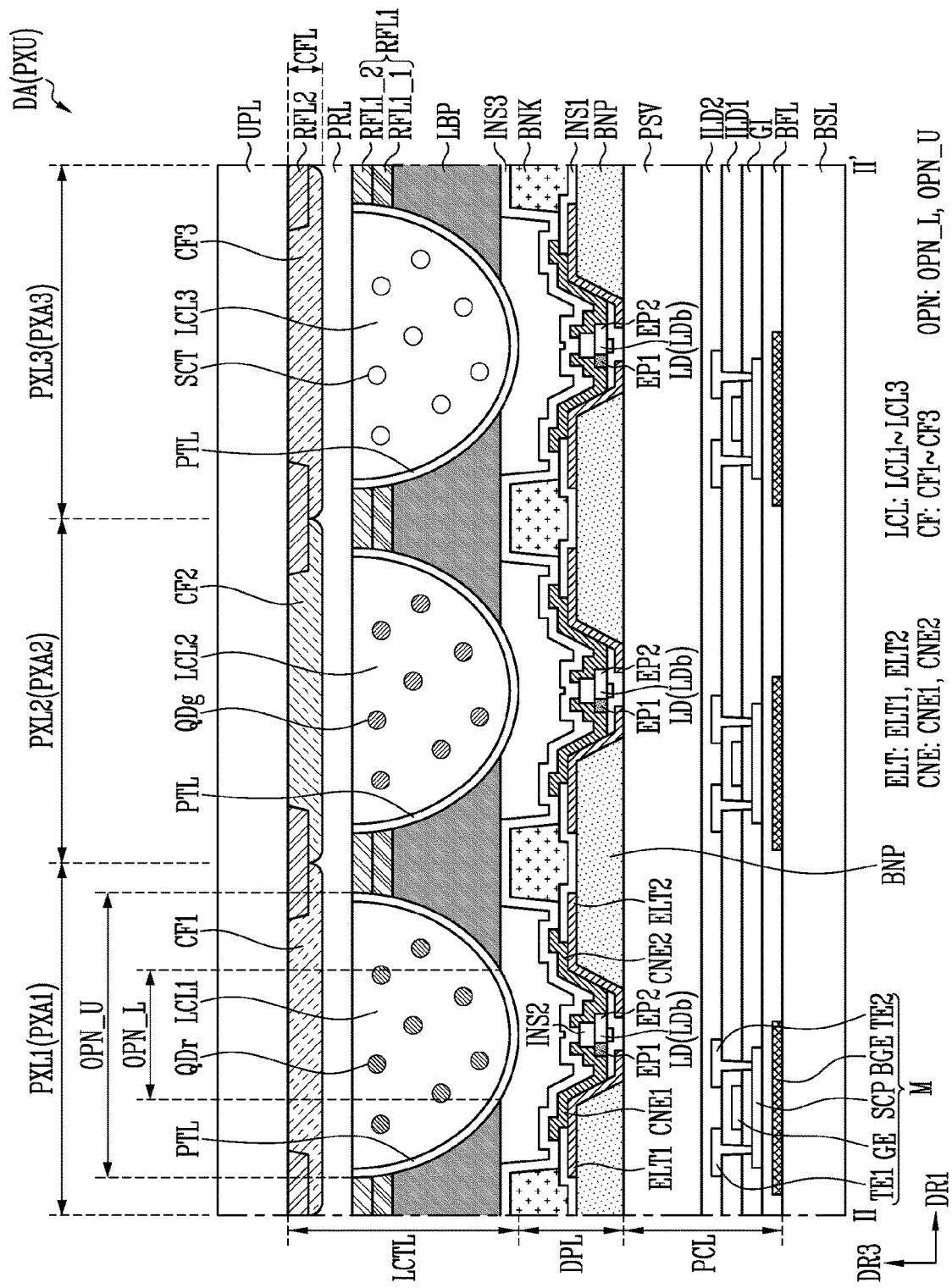

Referring to FIGS. 23 and 24, the pixels PXL may be formed on a surface of the base layer BSL, and the light control layer LCTL may be formed on a surface of the upper substrate UPL to face the pixels PXL. For example, the color filter layer CFL, the first, second, and third light conversion layers LCL1, LCL2, and LCL3, the light blocking layer LBP, and/or the first reflective layer RFL1 may be formed on the surface of the upper substrate UPL.

In an embodiment, the light control layer LCTL may include a protective layer PRL covering the first, second, and third light conversion layers LCL1, LCL2, and LCL3, and a surface of the first reflective layer RFL1. For example, the light control layer LCTL may include a first protective layer PRL1 interposed between the first, second, and third light conversion layers LCL1, LCL2, and LCL3 and first reflective layer RFL1 and the color filter layer CFL. The light control layer LCTL may selectively further include a second protective layer PRL2 provided on the surfaces of the first, second, and LCL3 (or the passivation layer PTL) and the light blocking layer LBP. For example, the light control layer LCTL may include the first and second protective layers PRL1 and PRL2 as illustrated in FIG. 23, or may include the protective layer PRL (corresponding to the first protective layer PRL1 in FIG. 23) interposed between the first, second, and third light conversion layers LCL1, LCL2, and LCL3 and first reflective layer RFL1 and the color filter layer CFL, and may not include the second passivation layer PRL2 as illustrated in FIG. 24. For example, in case that stability for the first, second, and third light conversion layers LCL1, LCL2, and LCL3 is secured by the passivation layer PTL, the second passivation layer PRL2 may be omitted.

In the embodiments of FIGS. 23 and 24, the display element layer DPL may selectively include the bank BNK. For example, the display element layer DPL may effectively prevent light leakage by including the bank BNK disposed in the boundary regions of the pixels PXL.

In an embodiment, as illustrated in FIG. 23, the third insulating layer INS3 may include at least organic layer and may have a flat surface. In another embodiment, as illustrated in FIG. 24, the third insulating layer INS3 may include at least one inorganic layer and may have a surface profile protruding upward in a region having the bank BNK. In addition, a region of the first, second, and third light conversion layers LCL1, LCL2, and LCL3 may be disposed inside a region surrounded by the bank BNK to be closer to the light-emitting elements LD. By reducing a gap between the upper and lower panels of the display panel DP, the light efficiency of the pixels PXL can be increased, and by bringing the pixels PXL and the light control layer LCTL into close contact with each other, the light leakage of the pixels PXL may be effectively prevented.

Figure 25:
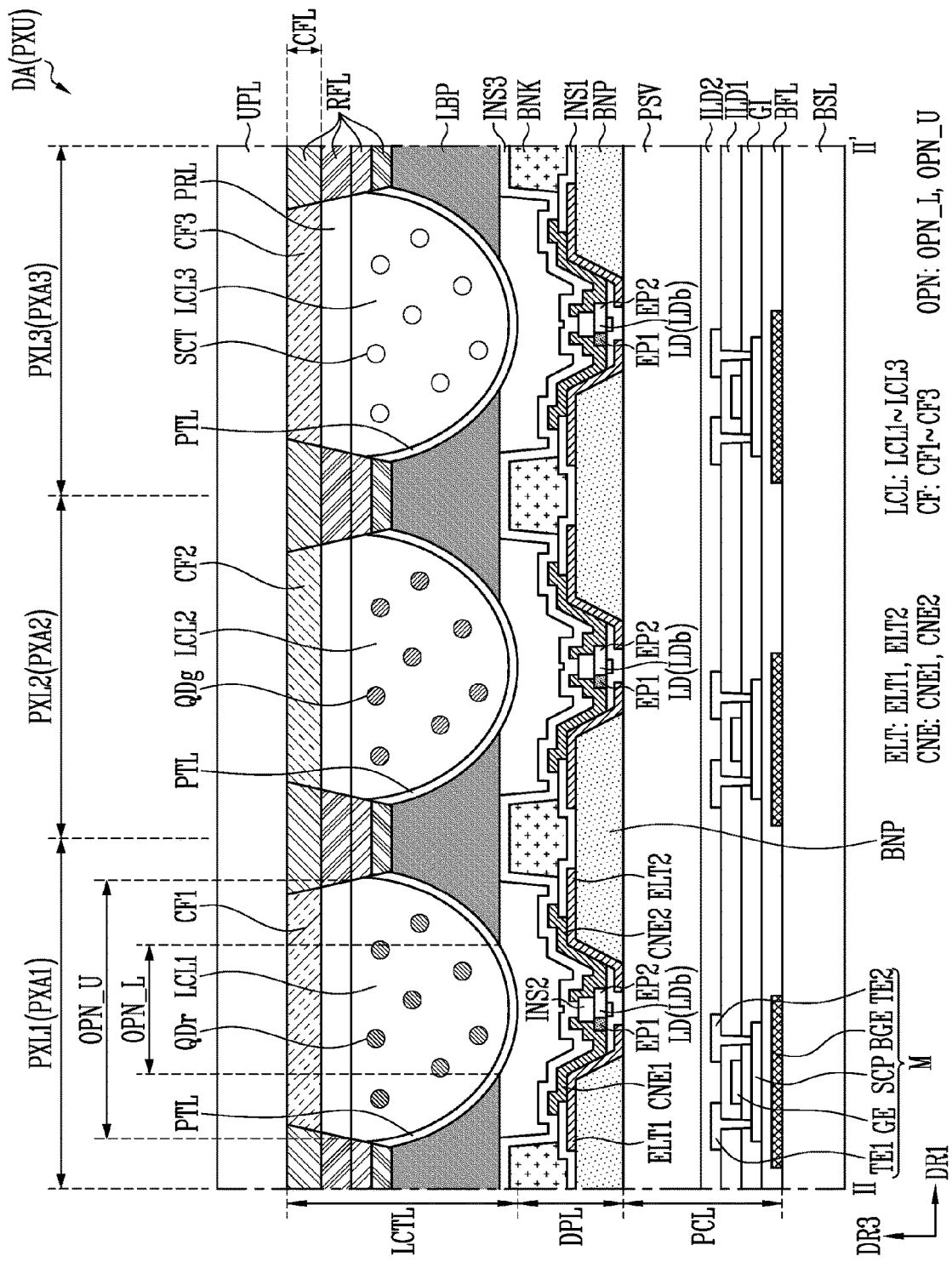

Referring to FIG. 25, the first and second reflective layers RFL1 and RFL2 illustrated in the embodiments of FIGS. 21 to 24 may be combined into a multilayered reflective layer RFL. For example, the multilayered reflective layer RFL may be formed on a surface of the upper substrate UPL, and each color filter CF, protective layer PRL, and light conversion layer LCL may be sequentially formed in each region defined by the multilayered reflective layer RFL. According to an embodiment, at least one layer (e.g., at least one layer of a metal layer disposed relatively close to the base layer BSL) constituting the multilayered reflective layer RFL may be provided at a height less than or equal to that of the first, second, and third light conversion layers LCL1, LCL2, and LCL3. In case that the reflective layer RFL is formed to have a sufficient thickness even using a single layer (e.g., single-layered metal layer), the reflective layer RFL may be formed as a single layer.

Figure 26:
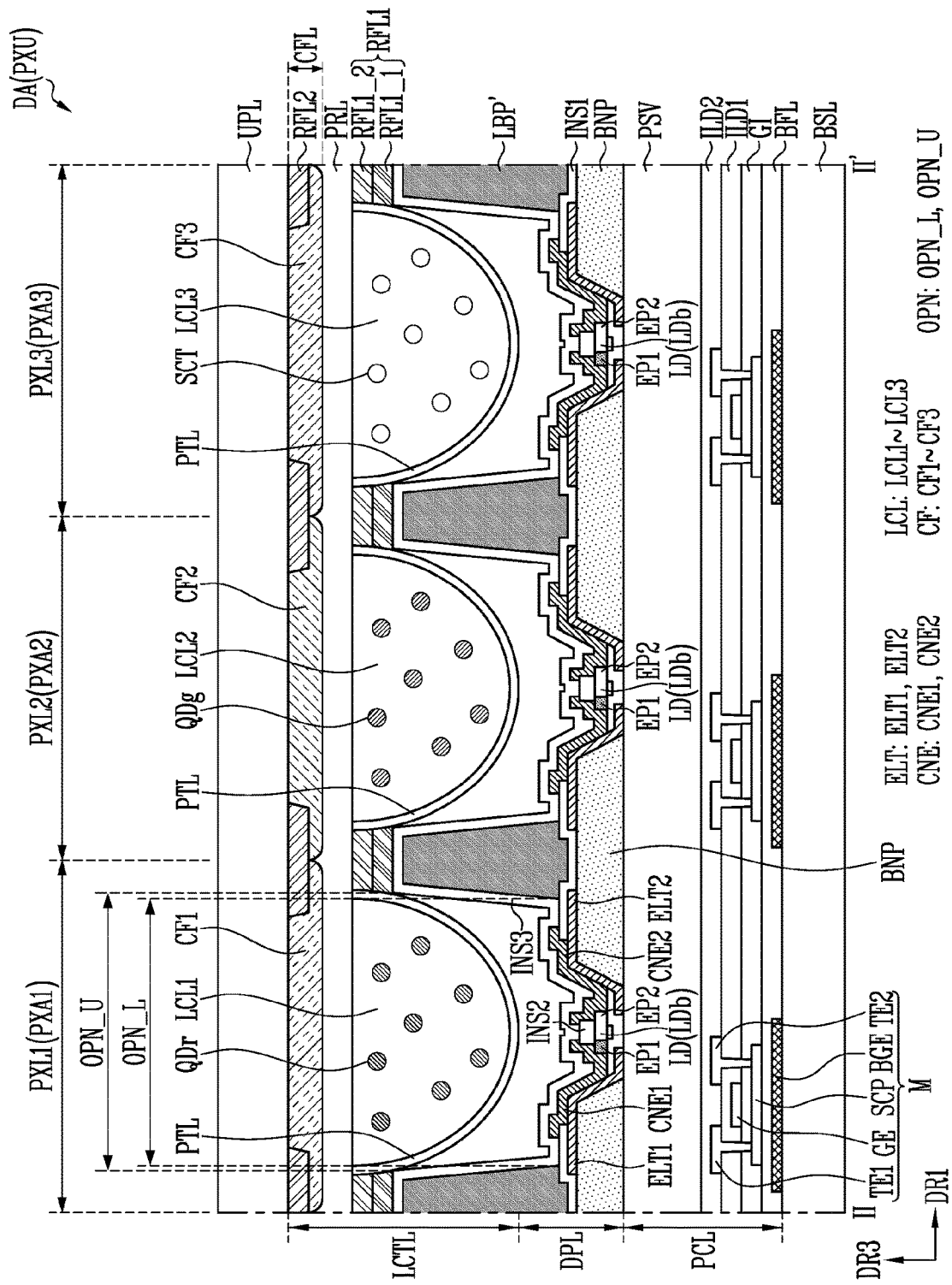

Referring to FIG. 26, the light blocking layer LBP' may be formed on a surface of the base layer BSL to face the first reflective layer RFL1. For example, the light blocking layer LBP' may be formed on the base layer BSL and may be formed by combining the bank BNK and the light blocking layer LBP according to the embodiments of FIGS. 23 to 25.

In an embodiment, the third insulating layer INS3 may be formed entirely in the display area DA having the light blocking layer LBP' to cover the light blocking layer LBP', but is not limited thereto. For example, in another embodiment, the third insulating layer INS3 may cover the light-emitting areas EA of the pixels PXL, and a portion of the third insulating layer INS3 formed on the light blocking layer LBP' may be removed. In another embodiment, the third insulating layer INS3 may be omitted, and the light blocking layer LBP' may contact the first reflective layer RFL1.

According to various embodiments as described above, the first reflective layer RFL1 and/or the second reflective layer RFL2 may be disposed around the light conversion layer LCL disposed in the light-emitting area EA of each pixel PXL. For example, the first reflective layer RFL1 and/or the second reflective layer RFL2 may be disposed on the light blocking layers LBP and LBP' provided in the non-light-emitting areas NEA of the pixels PXL. Therefore, it may be possible to provide a mirror type of the display device DD and satisfy diversified consumers' needs.

Further, according to various embodiments, recycling of light emitted from each pixel PXL may be induced by at least the first reflective layer RFL1. Therefore, light efficiency of the pixels PXL and the display device DD including the same may be increased.

Technical aspects of the disclosure have been specifically described according to the embodiments, but it should be noted that the foregoing embodiments are provided only for illustration while not limiting the disclosure. It will be understood by those skilled in the art that various changes in form and details may be made therein without departing from the scope of the disclosure.

What is claimed is:

1. A display device comprising:
   a base layer including a display area;
   a first pixel, a second pixel, and a third pixel that are disposed in the display area and include light-emitting elements disposed in light-emitting areas;
   an insulating layer disposed in the display area to cover the light-emitting areas and having a flat surface;
   a first light conversion layer, a second light conversion layer, and a third light conversion layer that are disposed on the flat surface of the insulating layer corresponding to the light-emitting areas of the first pixel, the second pixel, and the third pixel, respectively;
   a light blocking layer disposed between the first light conversion layer, the second light conversion layer, and the third light conversion layer on the insulating layer and having a height lower than the first light conversion layer, the second light conversion layer, and the third light conversion layer, the light blocking layer surrounding a portion of side surfaces of the first light conversion layer, the second light conversion layer, and the third light conversion layer; and
   a first reflective layer disposed on the light blocking layer, the first reflective layer surrounding the first light conversion layer, the second light conversion layer, and the third light conversion layer.

2. The display device of claim 1, wherein
   with respect to a surface of the base layer, the first reflective layer includes a height less than or equal to a height of the first light conversion layer, the second light conversion layer, and the third light conversion layer, and
   the first reflective layer includes openings corresponding to the first light conversion layer, the second light conversion layer, and the third light conversion layer.

3. The display device of claim 1, wherein the first pixel, the second pixel, and the third pixel include light-emitting elements which emit light of a same color.

4. The display device of claim 3, wherein at least one of the first light conversion layer, the second light conversion layer, and the third light conversion layer includes color conversion particles which convert light emitted from the light-emitting elements into light of a different color.

5. The display device of claim 3, wherein at least one of the first light conversion layer, the second light conversion layer, and the third light conversion layer includes light scattering particles which scatter light emitted from the light-emitting elements.

6. The display device of claim 1, wherein each of the first light conversion layer, the second light conversion layer, and the third light conversion layer has a dome shape and protrudes to a height higher than the first reflective layer with respect to a surface of the base layer.

7. The display device of claim 1, wherein the first reflective layer includes at least one metal layer.

8. The display device of claim 7, wherein the first reflective layer includes:
   a first metal layer including a first metal material; and
   a second metal layer disposed on the first metal layer and including a second metal material.

9. The display device of claim 1, wherein
   each of the first light conversion layer, the second light conversion layer, and the third light conversion layer has a flat upper surface, and
   with respect to a surface of the base layer, the first reflective layer, the first light conversion layer, the second light conversion layer, and the third light conversion layer have a same height.

10. The display device of claim 1, wherein the light blocking layer includes a black matrix material.

11. The display device of claim 1, further comprising at least one of:
    a protective layer overlapping the first light conversion layer, the second light conversion layer, the third light conversion layer, and the first reflective layer; and
    a color filter layer disposed on the first light conversion layer, the second light conversion layer, the third light conversion layer, the first reflective layer, and the protective layer.

12. The display device of claim 11, wherein the protective layer includes at least one organic layer, and planarizes a surface of a light control layer including the first light conversion layer, the second light conversion layer, and the third light conversion layer, the light blocking layer, and the first reflective layer.

13. The display device of claim 11, wherein the color filter layer includes:
    a first color filter disposed on the first light conversion layer;
    a second color filter disposed on the second light conversion layer;
    a third color filter disposed on the third light conversion layer; and
    a second reflective layer disposed between the first color filter, the second color filter, and the third color filter and surrounding the first color filter, the second filter, and the third color filter.

14. The display device of claim 13, wherein the second reflective layer includes at least one metal layer.

15. The display device of claim 13, further comprising:
    an encapsulation layer disposed on the color filter layer and disposed on a surface of the base layer to seal the display area.

16. The display device of claim 13, further comprising:
    an upper substrate disposed on the color filter layer.

17. The display device of claim 16, wherein
    the first pixel, the second pixel, the third pixel, the first light conversion layer, the second light conversion layer, the third light conversion layer, the light blocking layer, and the first reflective layer are disposed on a surface of the base layer, and the color filter layer is disposed on a surface of the upper substrate facing the surface of the base layer.

18. The display device of claim 16, wherein
the first pixel, the second pixel, and the third pixel are disposed on a surface of the base layer, and
the first light conversion layer, the second light conversion layer, the third light conversion layer, the first reflective layer, and the color filter layer are disposed on a surface of the upper substrate to face the first pixel, the second pixel, and the third pixel.

19. The display device of claim 18, wherein the light blocking layer is disposed on the surface of the base layer to face the first reflective layer.

20. The display device of claim 1, further comprising:
a light-blocking bank disposed in non-light-emitting areas of the first pixel, the second pixel, and the third pixel to surround the light-emitting areas of each of the first pixel, the second pixel, and the third pixel.

* * * * *